US007222033B1

United States Patent
Newson et al.

(10) Patent No.: US 7,222,033 B1
(45) Date of Patent: May 22, 2007

(54) ELECTROMAGNETIC EMISSIONS AND SUSCEPTIBILITY CALCULATING METHOD AND APPARATUS

(76) Inventors: Steven Lynn Newson, 2306 Voorhees Ave., #B, Redondo Beach, CA (US) 90278; Randall Tadao Fujimoto, 714 N. Guadalupe Ave. #1, Redondo Beach, CA (US) 90277

(*) Notice: Subject to any disclaimer, the term of this patent is extended or adjusted under 35 U.S.C. 154(b) by 0 days.

(21) Appl. No.: 10/920,489

(22) Filed: Aug. 17, 2004

Related U.S. Application Data

(60) Provisional application No. 60/495,798, filed on Aug. 18, 2003.

(51) Int. Cl.
*G06F 17/00* (2006.01)
(52) U.S. Cl. .................... 702/65; 702/64; 702/58; 703/13
(58) Field of Classification Search ............ 702/65, 702/57–59, 64, 70, 66, 67, 69, 76, 77, 115, 702/124, 126, 189; 703/2–5, 13; 716/10
See application file for complete search history.

(56) References Cited

U.S. PATENT DOCUMENTS

| 4,278,933 A | 7/1981 | Klopach ............... 324/627 |
| 5,650,935 A | 7/1997 | Nishino ............... 702/57 |
| 5,689,192 A * | 11/1997 | Rogers ............... 324/627 |
| 5,745,370 A | 4/1998 | Ohtsu ............... 716/3 |
| 5,812,434 A | 9/1998 | Nagase ............... 703/2 |
| 5,815,414 A | 9/1998 | Funaki ............... 703/4 |
| 5,903,477 A | 5/1999 | Otsu ............... 703/5 |
| 6,083,266 A | 7/2000 | Ohtsu ............... 703/2 |
| 6,285,957 B1 | 9/2001 | Tanaka ............... 702/57 |
| 6,289,290 B1 | 9/2001 | Lee ............... 702/57 |
| 6,555,998 B1 | 4/2003 | Kishimoto ............... 324/76.11 |
| 6,604,225 B1 | 8/2003 | Otsu ............... 716/3 |
| 6,615,394 B2 | 9/2003 | Ogawa ............... 716/3 |
| 6,691,076 B1 | 2/2004 | Nagase ............... 703/2 |
| 6,700,388 B1 * | 3/2004 | Mayor et al. ............... 324/537 |
| 6,754,598 B2 | 6/2004 | Shimazaki ............... 702/70 |
| 6,766,261 B2 | 7/2004 | Nishino ............... 702/65 |
| 6,834,380 B2 * | 12/2004 | Khazei ............... 716/10 |
| 2002/0095304 A1 * | 7/2002 | Khazei ............... 705/1 |

* cited by examiner

*Primary Examiner*—Hal Wachsman
(74) *Attorney, Agent, or Firm*—Law Office of Michael N. Cohen PC; Michael N. Cohen

(57) ABSTRACT

A method and apparatus that predicts electromagnetic emissions and susceptibility attributes of an electric device. A simulation is conducted which utilizes a series of mathematical calculations to predict performance of four facets of electromagnetic interference (EMI): conducted emissions; conducted susceptibility; radiated emissions; and radiated susceptibility. The method and apparatus provides for the analytical evaluation of electromagnetic interference of electrical devices prior to testing and actual measuring of fields emitted by circuits, thereby providing a system for EMI control methods, EMI test costs, and device redesign and retest.

22 Claims, 20 Drawing Sheets

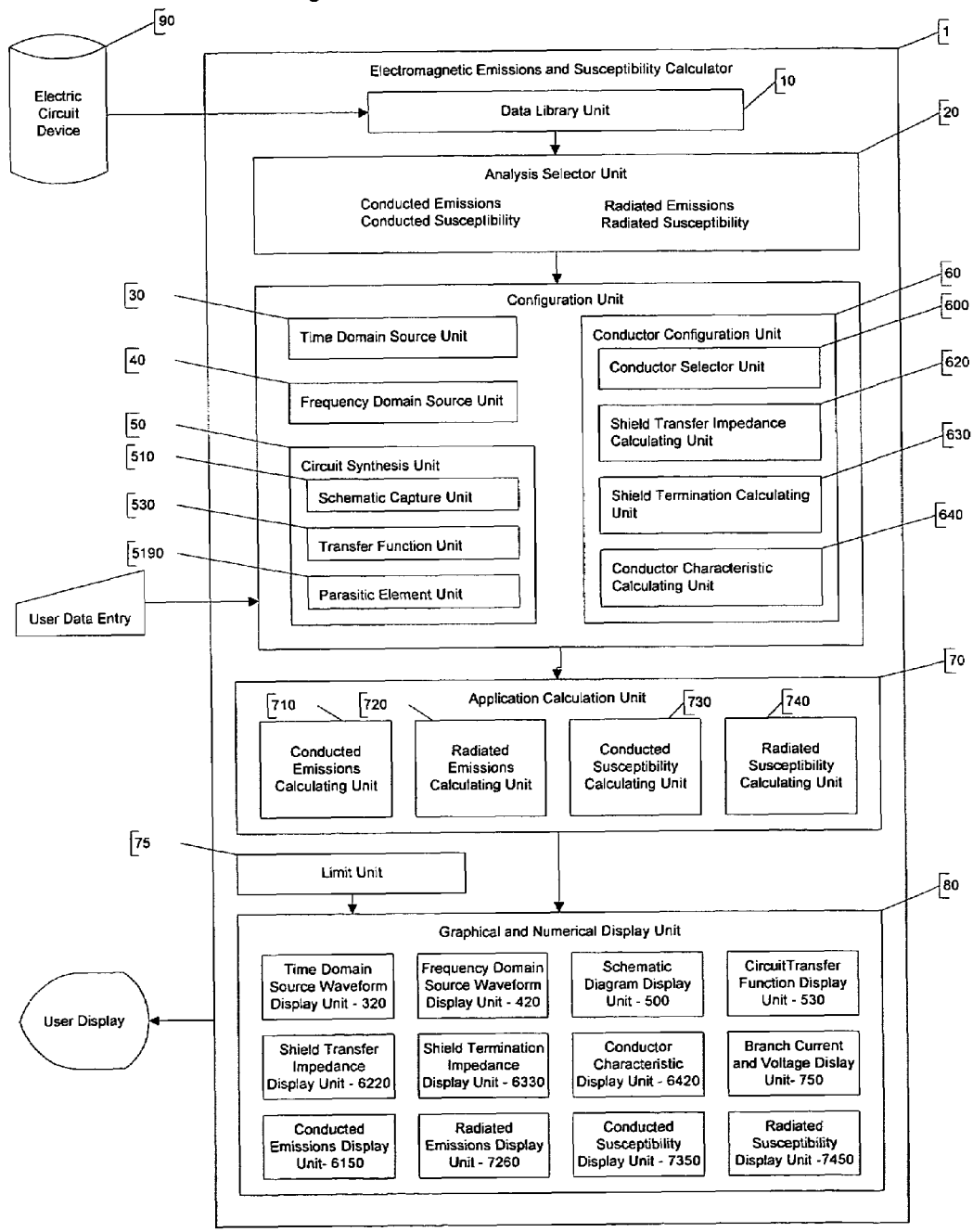

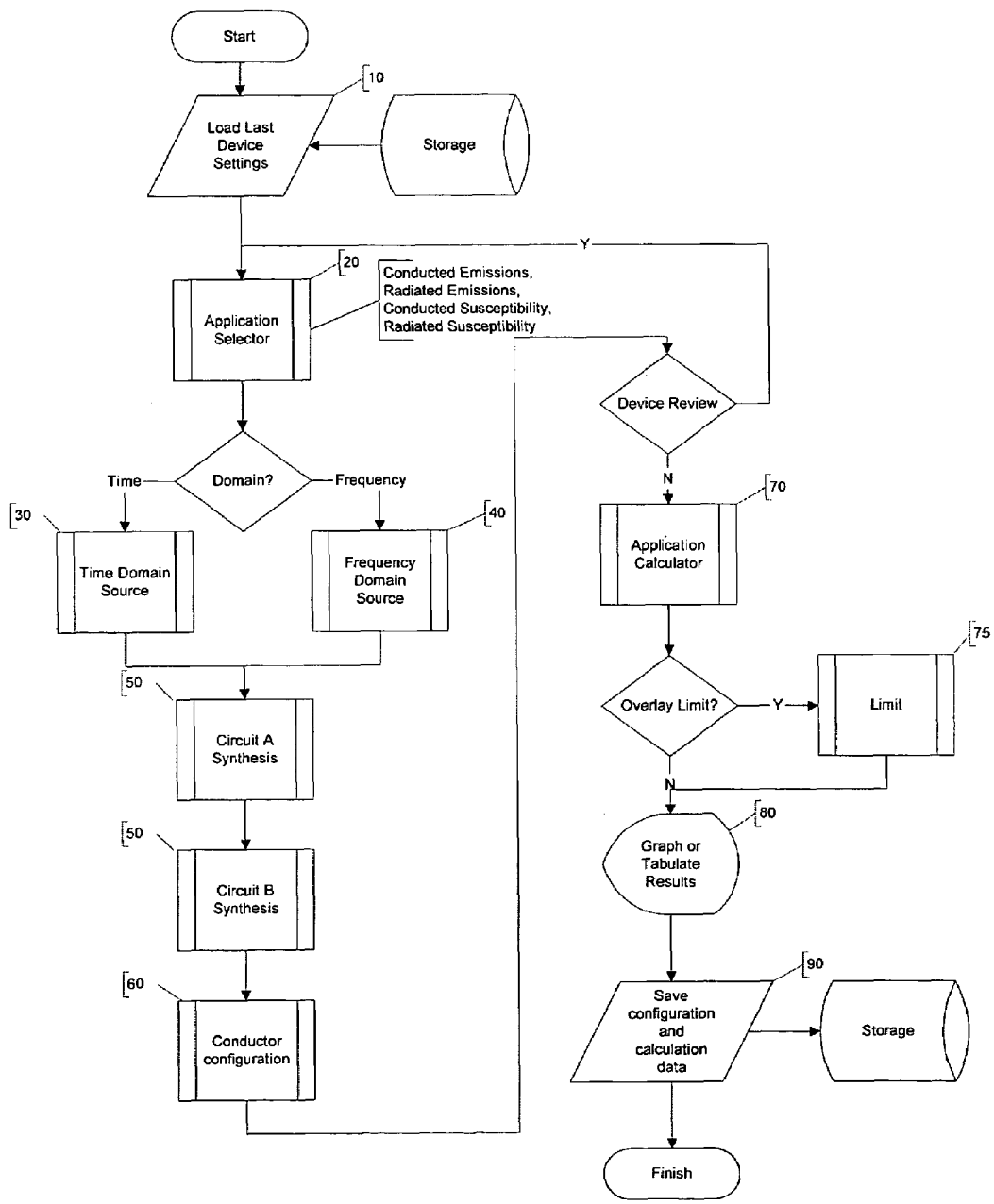
Figure 2 -- Flow Diagram, 1
Electromagnetic Emissions and Susceptibility Calculator

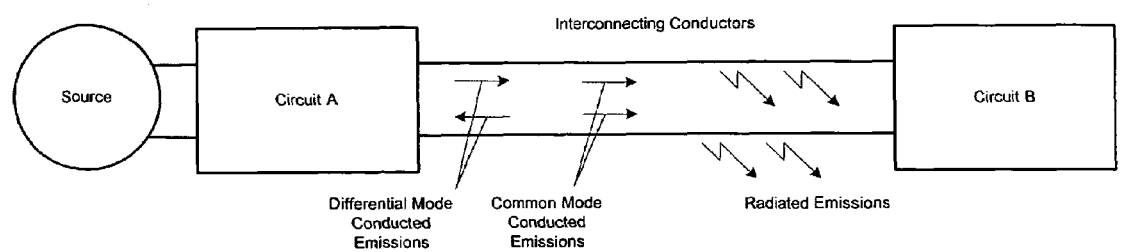
Figure 3 - Emissions Model
Electromagnetic Emissions and Susceptibility Calculator

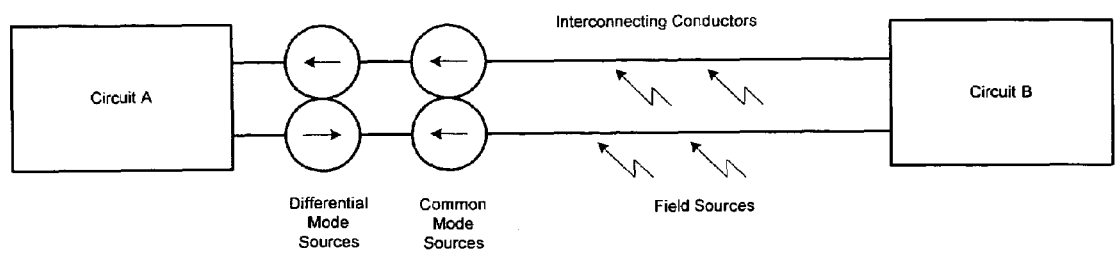
Figure 4 - Susceptibility Model
Electromagnetic Emissions and Susceptibility Calculator

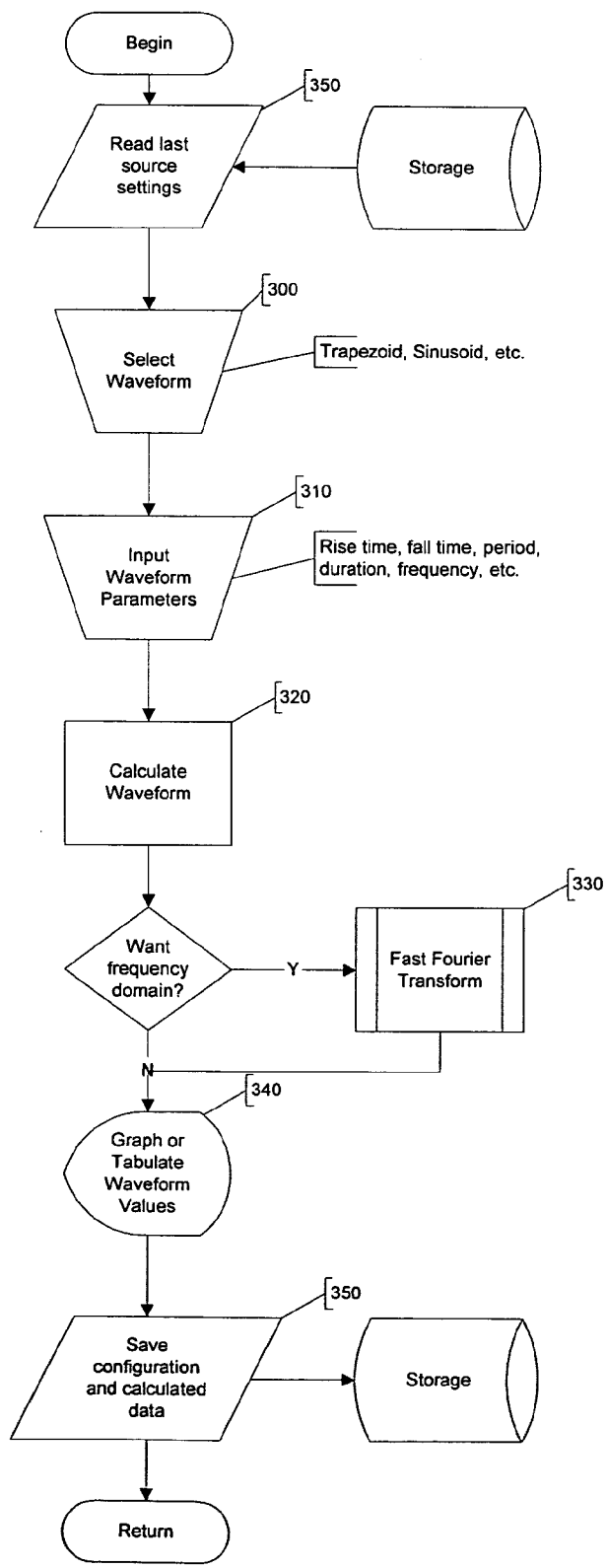
Figure 5 - Time Domain Source Unit, 30
Electromagnetic Emissions and Susceptibility Calculator

Figure 6 - Frequency Domain Source Unit, 40
Electromagnetic Emissions and Susceptibility Calculator
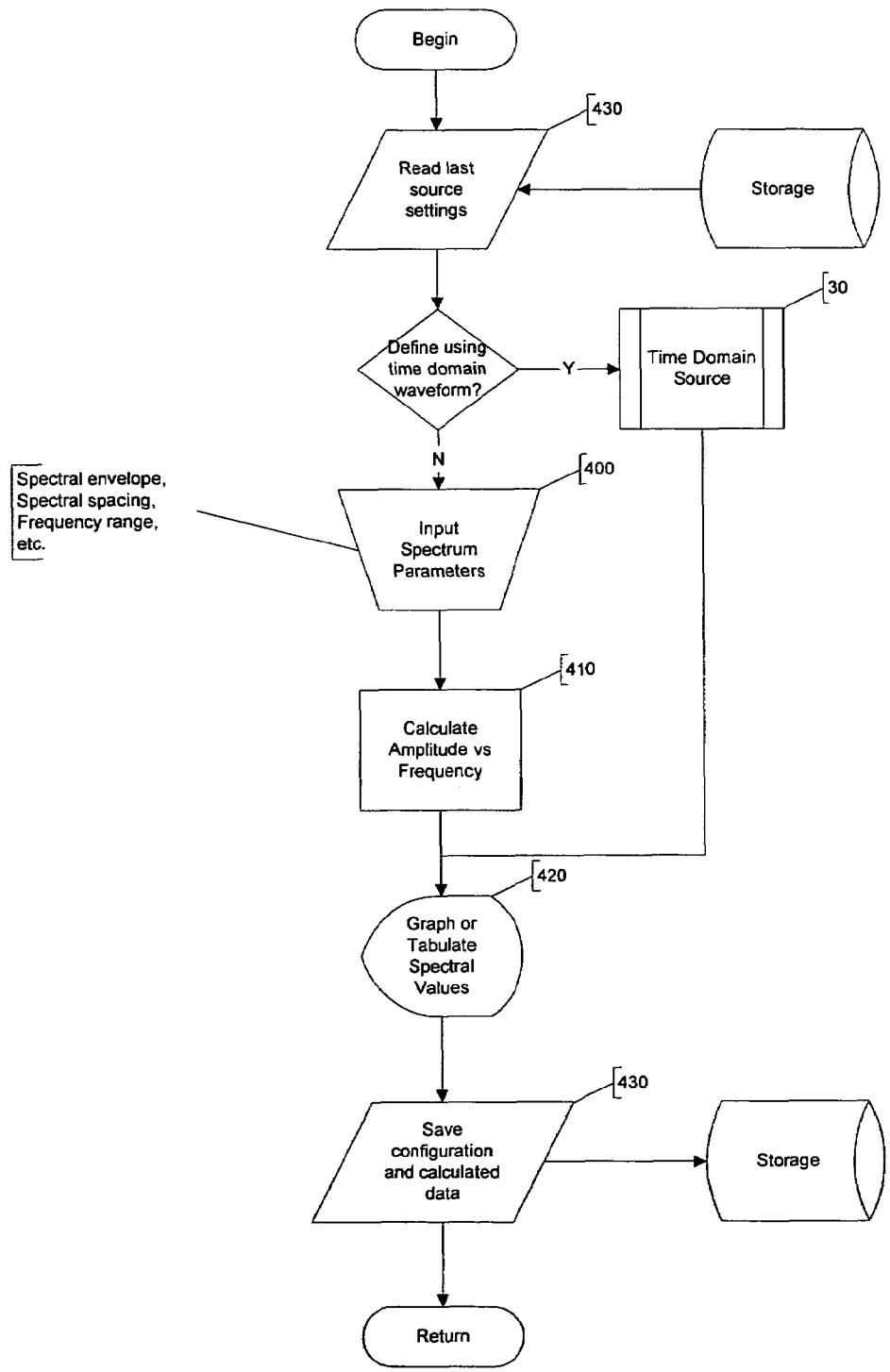

Figure 7 - Circuit Synthesis Unit, 50
Electromagnetic Emissions and Susceptibility Calculator
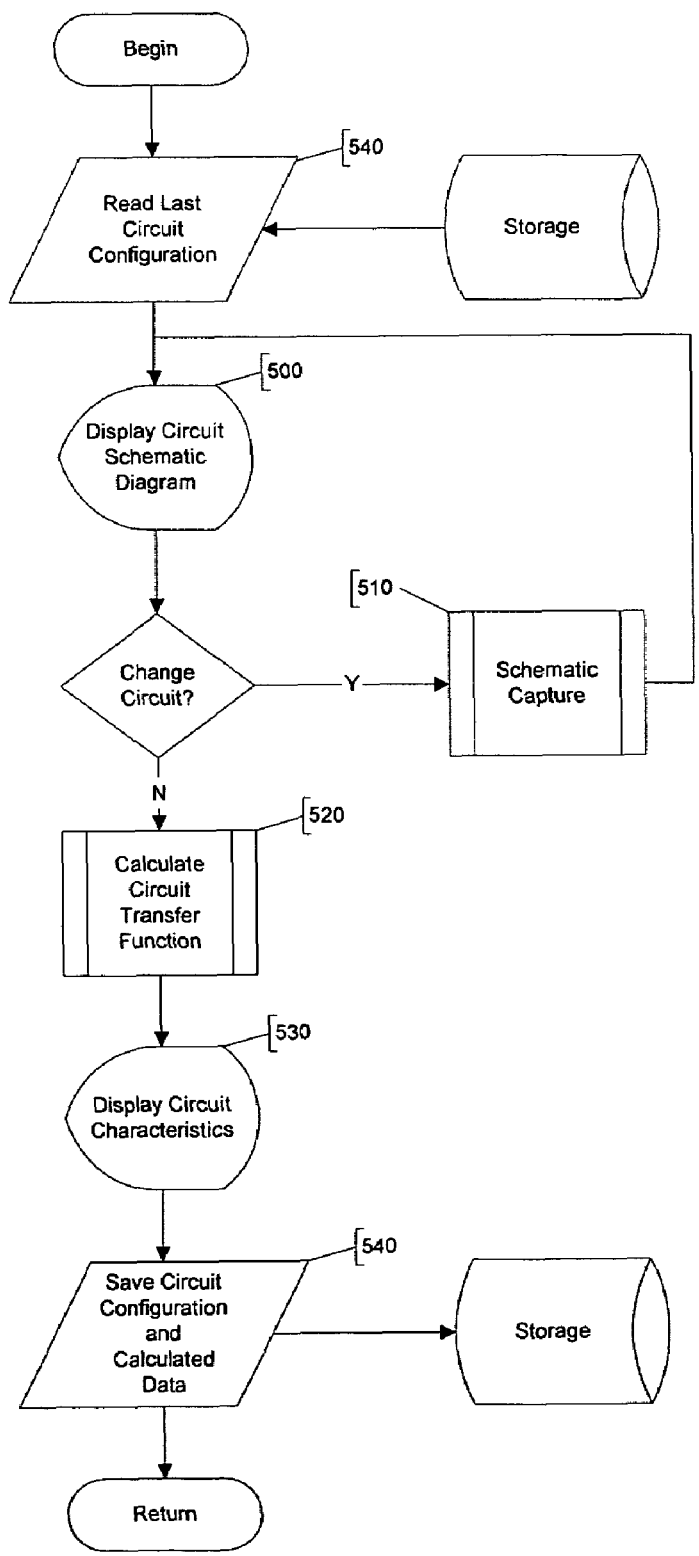

Figure 8 - Conductor Configuration Unit, 60
Electromagnetic Emissions and Susceptibility Calculator
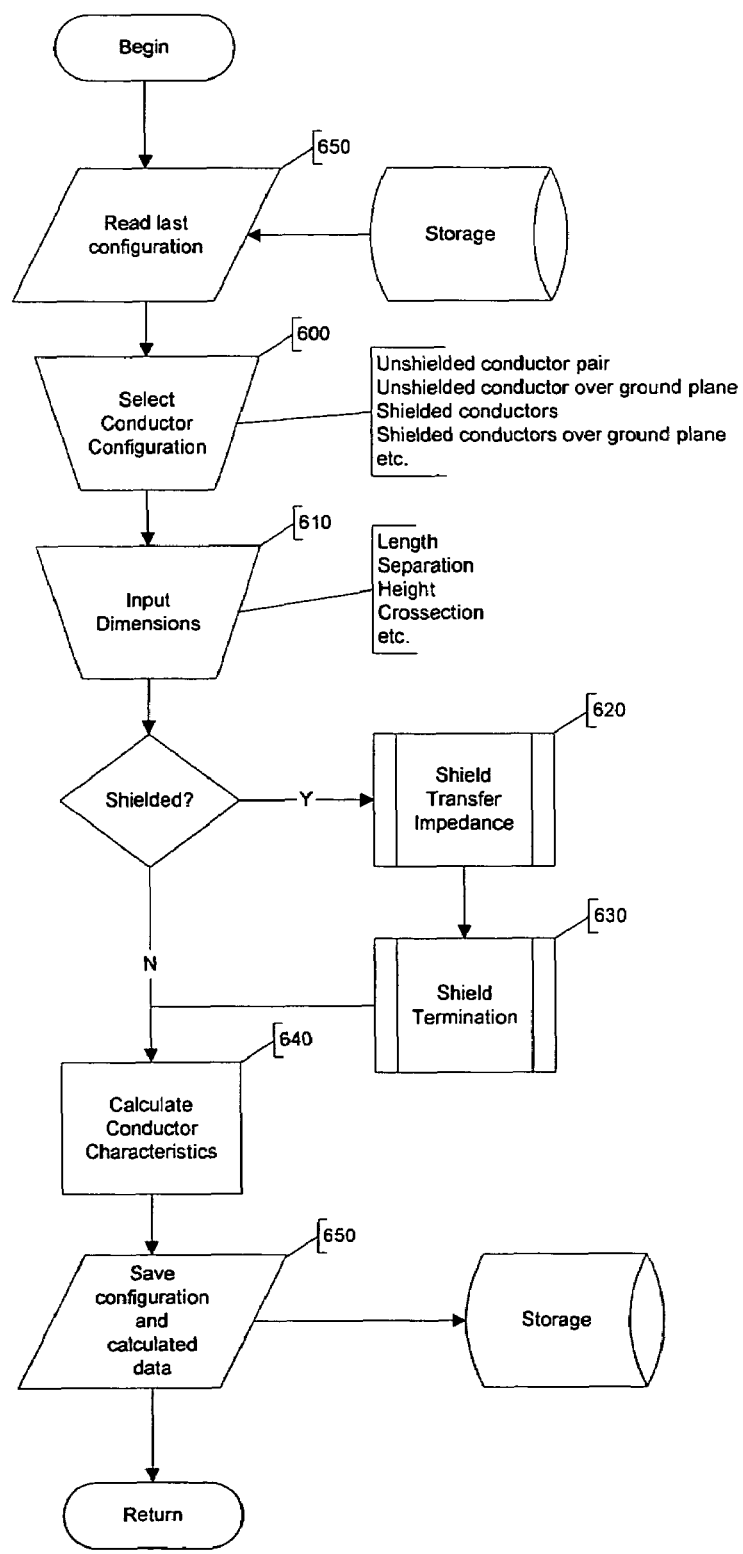

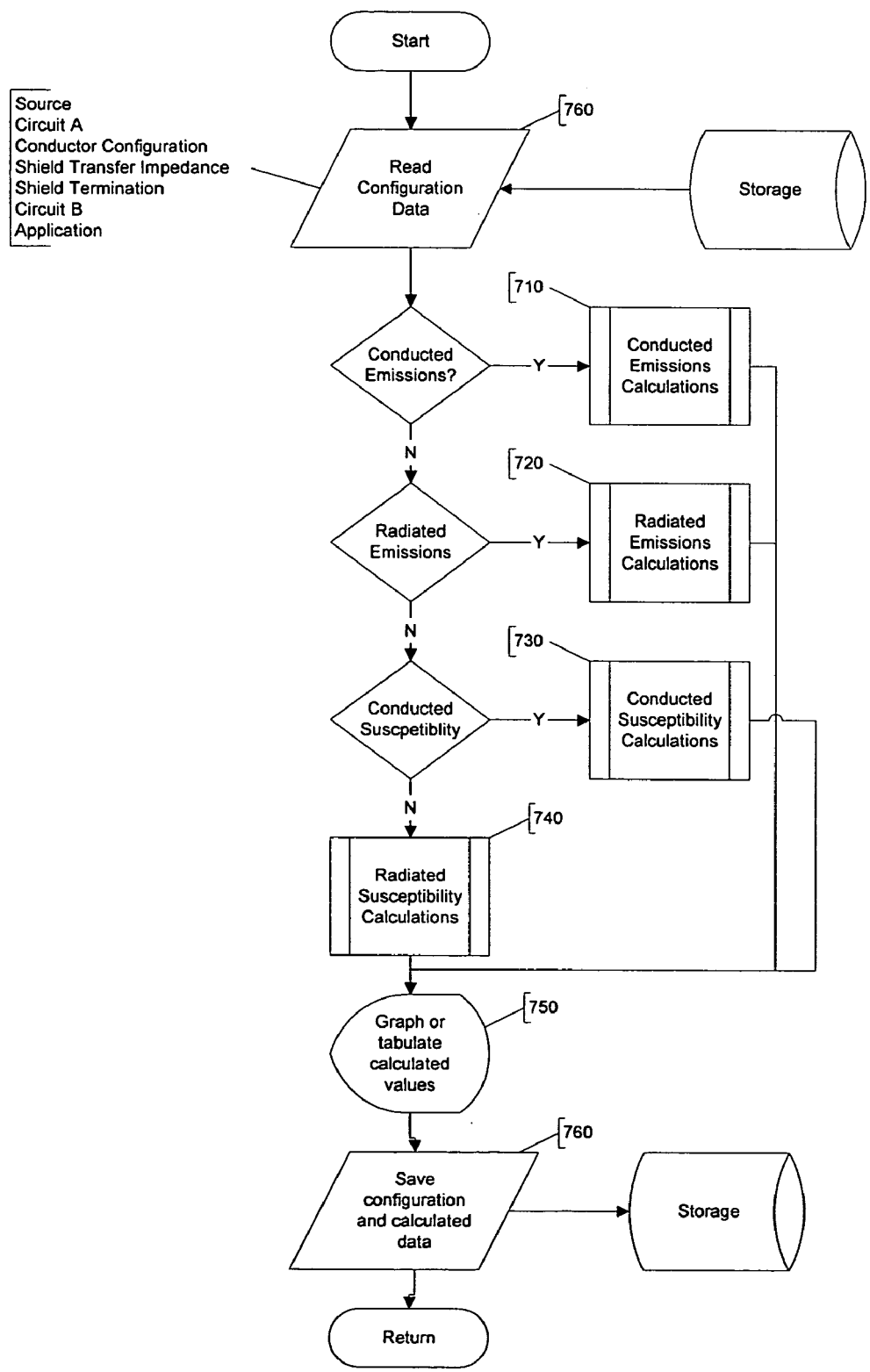
Figure 9 - Application Calculation Unit, 70
Electromagnetic Emissions and Susceptibility Calculator

Figure 10 - Limit Unit, 75
Electromagnetic Emissions and Susceptibility Calculator
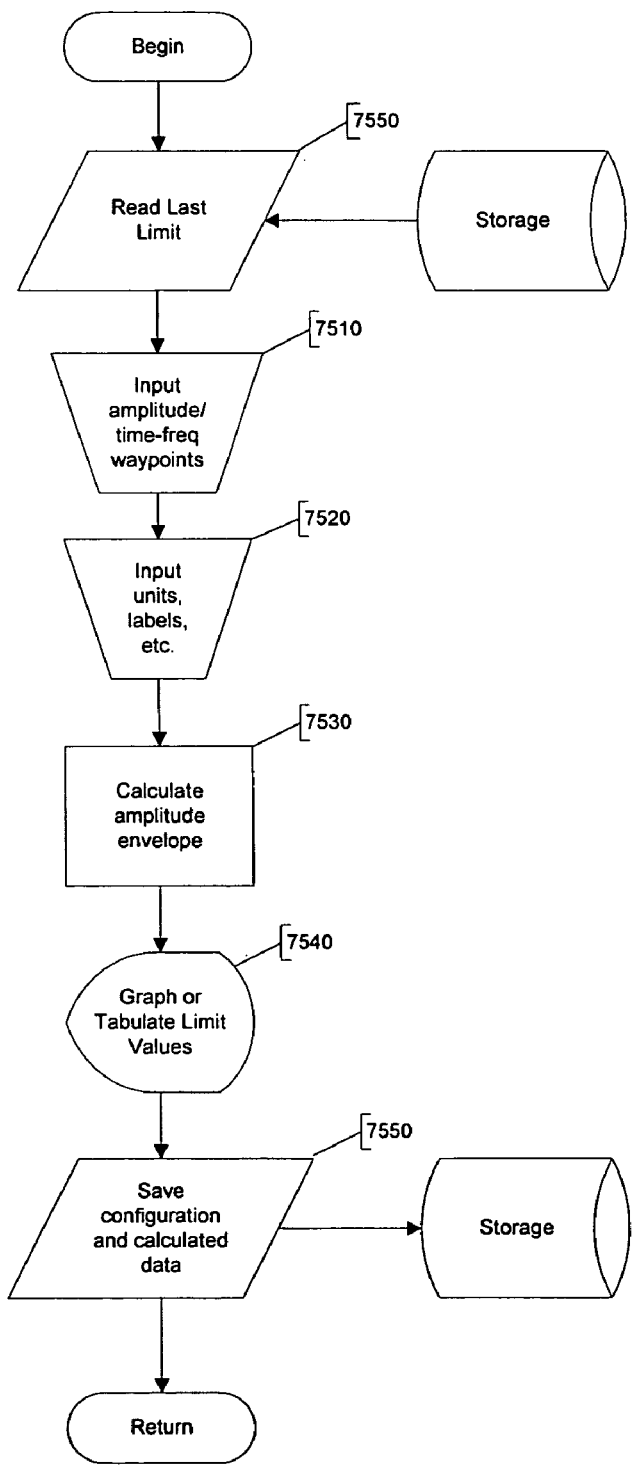

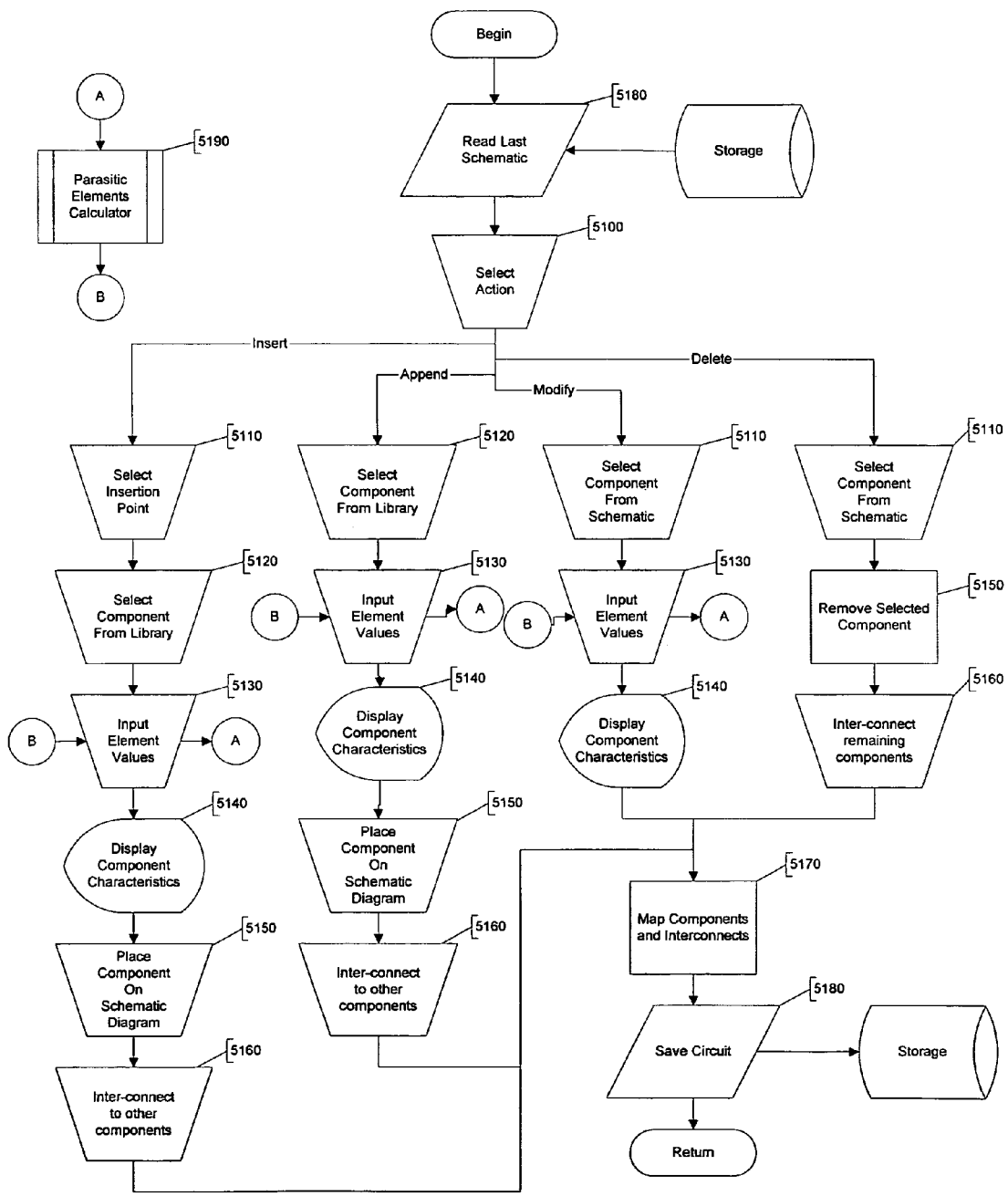
Figure 11 - Schematic Capture Unit, 510
Electromagnetic Emissions and Susceptibility Calculator

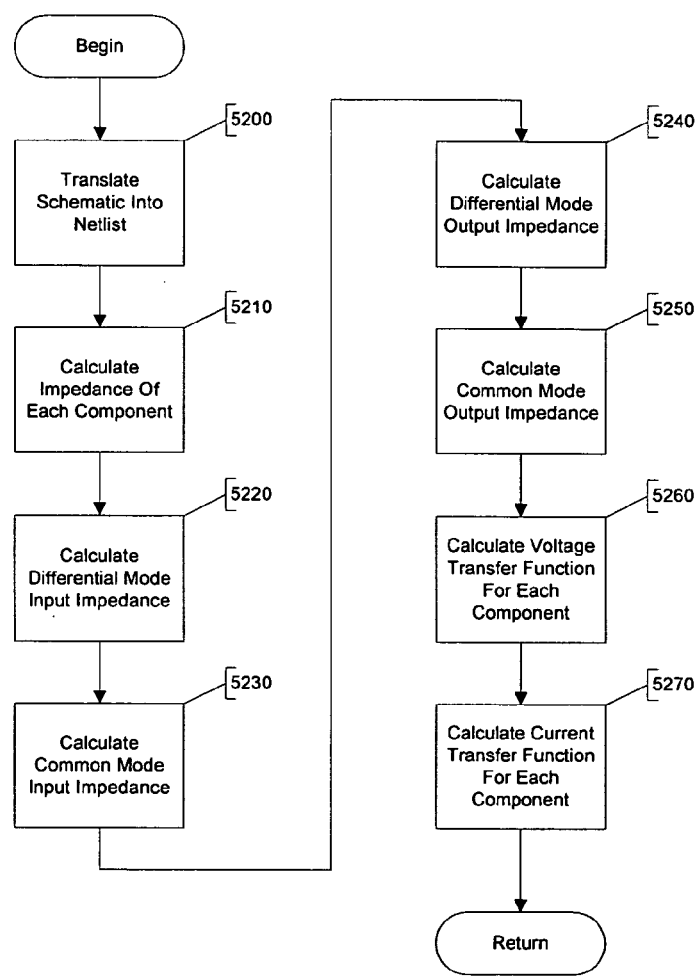
Figure 12 - Circuit Transfer Function Calculating Unit, 520
Electromagnetic Emissions and Susceptibility Calculator Figure 13 - Shield Transfer Impedance Calculating Unit, 620
Electromagnetic Emissions and Susceptibility Calculator
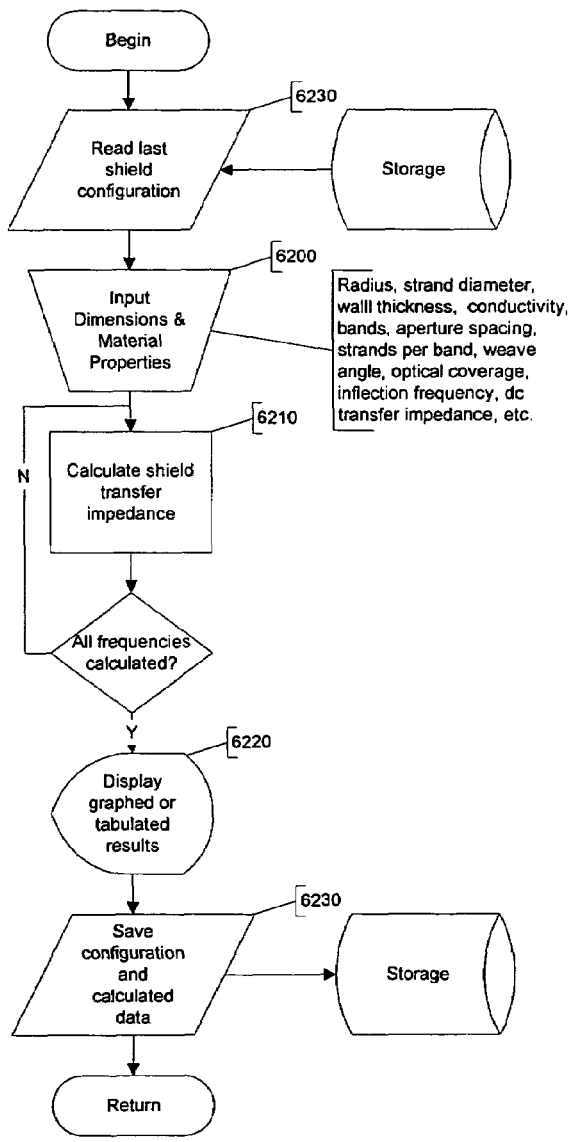

Figure 14 - Shield Termination Calculating Unit, 630
Electromagnetic Emissions and Susceptibility Calculator
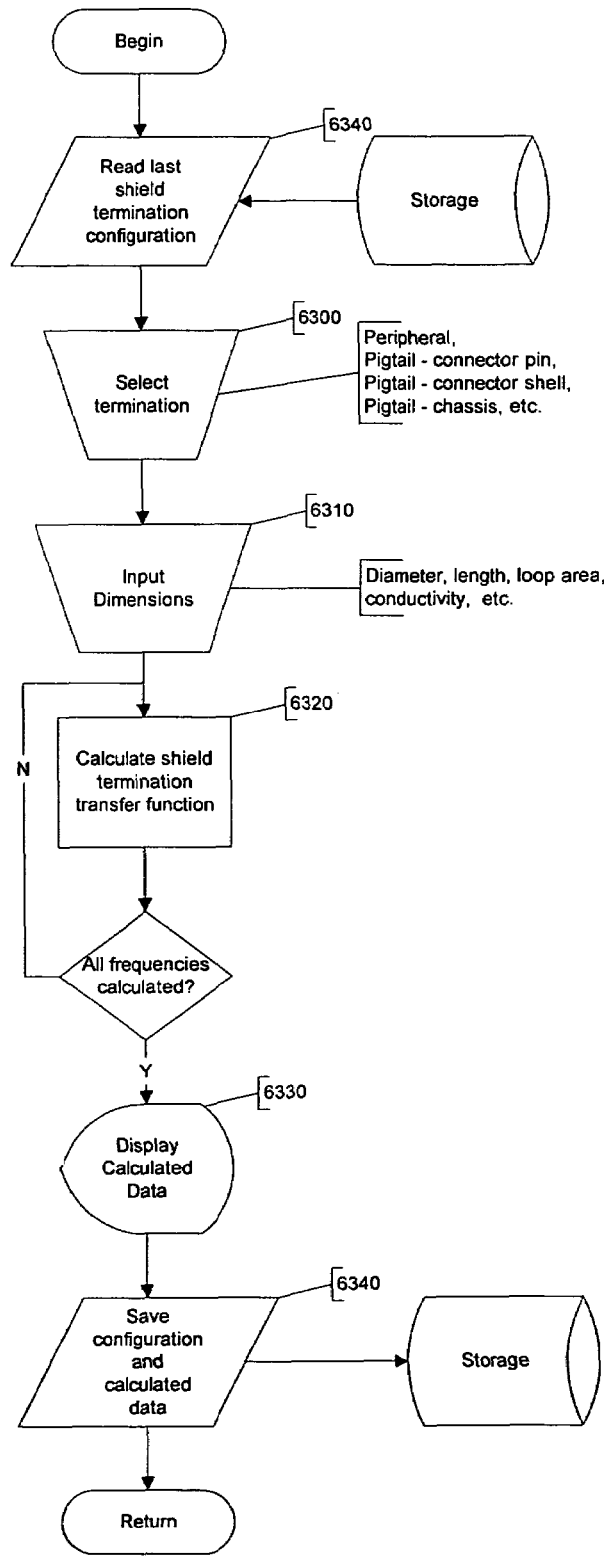

Figure 15 - Conductor Transfer Function Calculating Unit, 640
Electromagnetic Emissions and Susceptibility Calculator
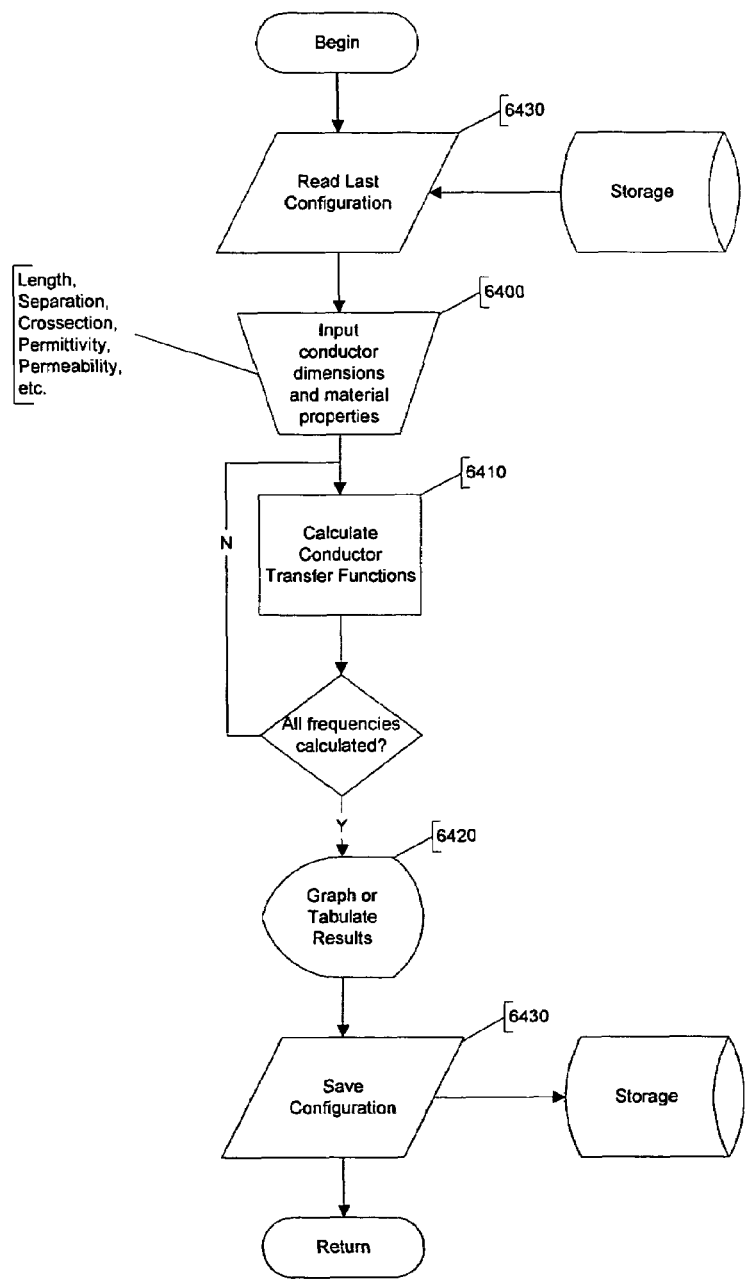

Figure 16 - Conducted Emissions Calculations Unit, 710
Electromagnetic Emissions and Susceptibility Calculator
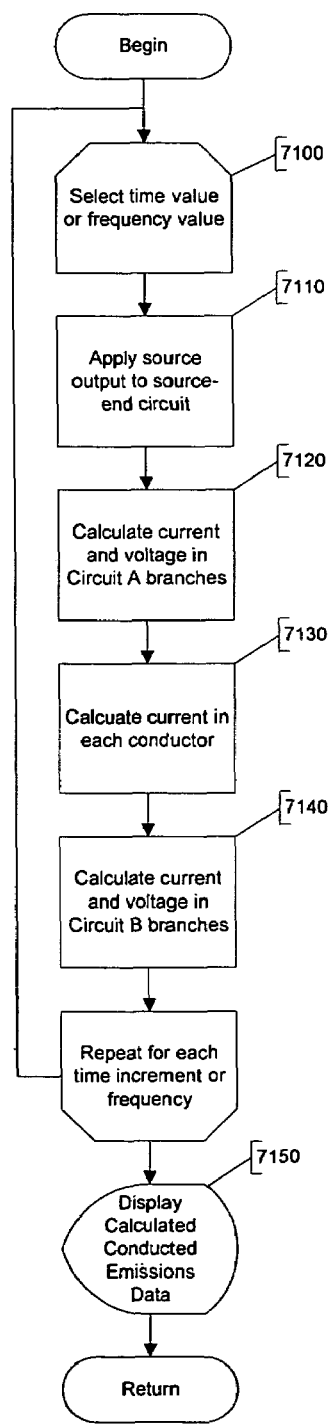

Figure 17 - Radiated Emissions Calculations Unit, 720
Electromagnetic Emissions and Susceptibility Calculator
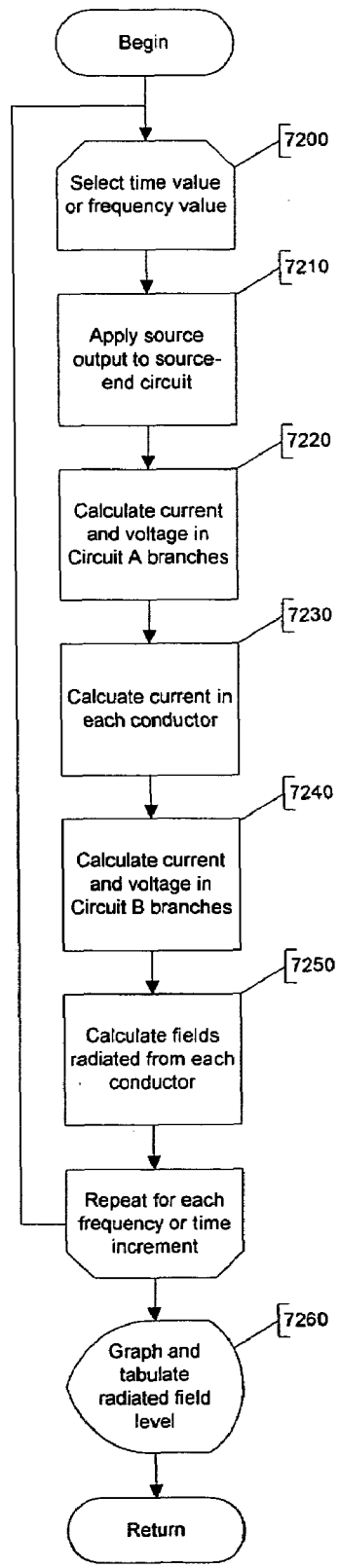

Figure 18 - Conducted Susceptibility Calculations Unit, 730
Electromagnetic Emissions and Susceptibility Calculator
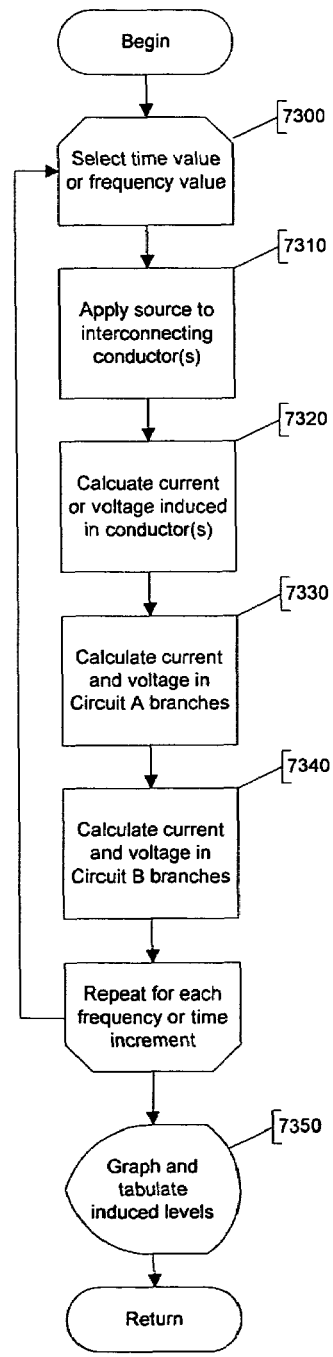

Figure 19 - Radiated Susceptibility Calculations Unit, 740
Electromagnetic Emissions and Susceptibility Calculator
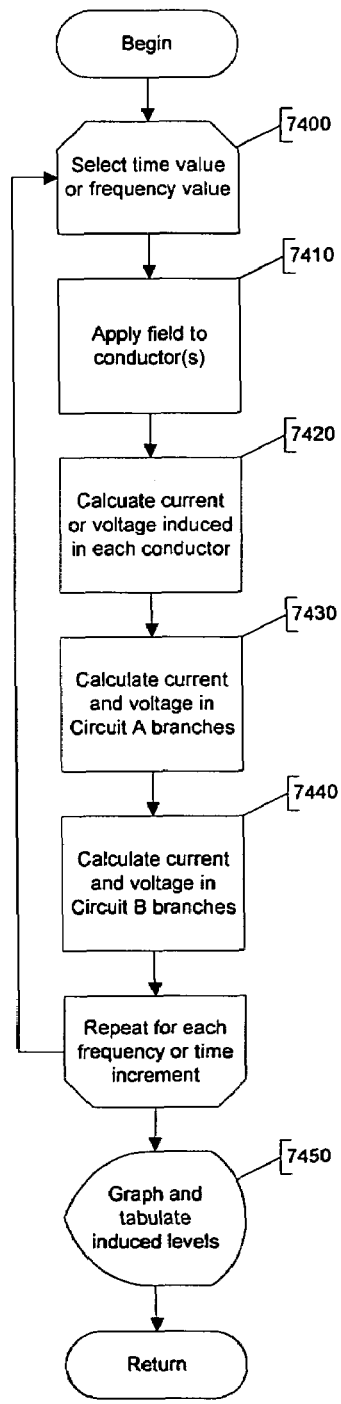

Figure 20 - Parasitic Element Calculating Unit, 5190
Electromagnetic Emissions and Susceptibility Calculator
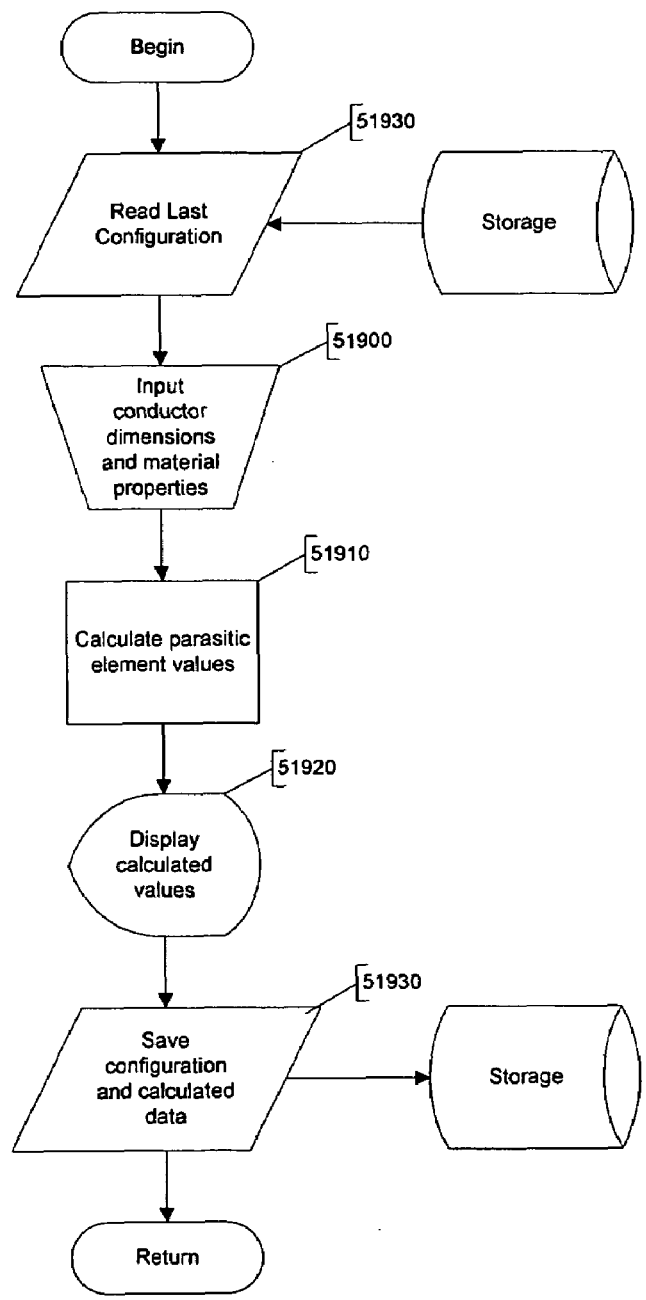

ELECTROMAGNETIC EMISSIONS AND SUSCEPTIBILITY CALCULATING METHOD AND APPARATUS

CROSS-REFERENCE TO RELATED APPLICATIONS

This application claims the benefit of PPA Appl. No. 60/495,798, filed 2003 Aug. 18 by the present inventors.

FEDERALLY SPONSORED RESEARCH

Not Applicable

SEQUENCE LISTING OR PROGRAM

The Program associated with the instant disclosure has been submitted as .txt files on CD-R (in duplicate). Each CD-R is marked in indelible ink to identify the Applicants, Title, Application No., and Creation Date. The Program submitted on CD-R is hereby incorporated by reference as follows:

| FILE NAME | SIZE | DATE | TIME |
| --- | --- | --- | --- |
| Biplanar.txt | 6,627 | Jun. 28, 2004 | 06:54 AM |
| Biplanars.txt | 286 | Feb. 20, 2004 | 11:52 AM |
| CableConfigurations.txt | 286 | Feb. 20, 2004 | 11:52 AM |
| Capacitor.txt | 6,164 | Jun. 28, 2004 | 06:52 AM |
| Capacitors.txt | 4,716 | Jun. 28, 2004 | 06:52 AM |
| clsComplexMatrix.txt | 79,537 | Aug. 16, 2004 | 08:51 AM |
| clsComplexNumberDoubles.txt | 24,603 | Jul. 3, 2004 | 06:01 AM |
| CMInductor.txt | 6,161 | Jun. 28, 2004 | 06:55 AM |
| CMInductors.txt | 4,622 | Jun. 28, 2004 | 06:55 AM |
| ComplexNumCalcs.txt | 2,115 | Jul. 3, 2004 | 06:01 AM |
| Coplanar.txt | 6,637 | Jun. 28, 2004 | 06:55 AM |
| Coplanars.txt | 1,087 | Apr. 1, 2004 | 01:24 PM |
| Dielectrics.txt | 1,087 | Apr. 1, 2004 | 01:24 PM |
| DMInductor.txt | 6,160 | Jun. 28, 2004 | 06:55 AM |
| DMInductors.txt | 4,624 | Jun. 28, 2004 | 06:55 AM |
| FeedThruCap.txt | 5,436 | Jun. 28, 2004 | 06:55 AM |
| FeedThruCaps.txt | 4,224 | Jun. 28, 2004 | 06:55 AM |
| Ferrite.txt | 5,739 | Jun. 28, 2004 | 06:55 AM |
| Ferrites.txt | 4,547 | Jun. 28, 2004 | 06:55 AM |
| frmAbout.txt | 10,845 | Aug. 15, 2004 | 09:53 AM |
| frmCableModule.txt | 271,586 | Aug. 15, 2004 | 10:19 AM |
| frmCableModuleResults.txt | 54,506 | Aug. 15, 2004 | 10:25 AM |
| frmComponentLibrary.txt | 490,850 | Aug. 16, 2004 | 09:06 AM |
| frmConfigurationSelector.txt | 18,574 | Aug. 15, 2004 | 09:53 AM |
| frmCSOptions.txt | 5,830 | Aug. 15, 2004 | 09:53 AM |
| frmDataTable.txt | 12,864 | Aug. 15, 2004 | 10:45 AM |
| frmEMISoftware.txt | 11,672 | Aug. 15, 2004 | 10:03 AM |
| frmFieldDirection.txt | 32,096 | Aug. 16, 2004 | 09:06 AM |
| frmFilter.txt | 12,208 | Aug. 15, 2004 | 09:53 AM |
| frmFilterSchematic.txt | 12,271 | Aug. 15, 2004 | 09:53 AM |
| frmFrequency.txt | 25,650 | Aug. 15, 2004 | 10:04 AM |
| frmGraph.txt | 33,206 | Aug. 15, 2004 | 10:55 AM |
| frmLimit.txt | 54,841 | Aug. 16, 2004 | 06:45 AM |
| frmLineDimensions.txt | 23,809 | Aug. 15, 2004 | 09:53 AM |
| frmLoadSchematic.txt | 12,208 | Aug. 15, 2004 | 09:53 AM |
| frmOutputSelector.txt | 4,912 | Aug. 15, 2004 | 09:53 AM |
| frmParasitics.txt | 235,832 | Aug. 15, 2004 | 11:03 AM |
| frmREOptions.txt | 6,314 | Aug. 15, 2004 | 09:53 AM |
| frmSchematic.txt | 269,636 | Aug. 16, 2004 | 11:41 AM |
| frmShieldTerminations.txt | 164,754 | Aug. 15, 2004 | 10:04 AM |
| frmSource.txt | 163,800 | Aug. 15, 2004 | 10:04 AM |
| frmSplashScreen.txt | 1,153 | Aug. 15, 2004 | 10:11 AM |
| frmTransferImpedance.txt | 328,714 | Aug. 15, 2004 | 10:04 AM |
| frmUserInterface.txt | 135,261 | Aug. 16, 2004 | 07:29 AM |
| Ghost.txt | 4,980 | Jun. 28, 2004 | 06:55 AM |
| Ghosts.txt | 4,114 | Aug. 16, 2004 | 09:40 AM |
| Graph.txt | 6,292 | Aug. 16, 2004 | 07:29 AM |
| Graphs.txt | 977 | Jun. 28, 2004 | 06:56 AM |
| IdealCapacitor.txt | 5,178 | Jun. 28, 2004 | 06:56 AM |
| IdealCapacitors.txt | 4,278 | Jun. 28, 2004 | 06:56 AM |
| IdealCMInductor.txt | 5,298 | Jun. 28, 2004 | 06:56 AM |
| IdealCMInductors.txt | 4,605 | Jun. 28, 2004 | 06:56 AM |
| IdealDMInductor.txt | 5,297 | Jun. 28, 2004 | 06:56 AM |
| IdealDMInductors.txt | 4,604 | Jun. 28, 2004 | 06:56 AM |
| IdealInductor.txt | 5,143 | Jun. 28, 2004 | 06:56 AM |
| IdealInductors.txt | 4,266 | Jun. 28, 2004 | 06:56 AM |
| IdealInvertingTransformer.txt | 5,671 | Jun. 28, 2004 | 06:56 AM |
| IdealInvertingTransformers.txt | 4,796 | Jun. 28, 2004 | 06:56 AM |
| IdealNonInvertingTransformer.txt | 5,564 | Aug. 16, 2004 | 11:42 AM |
| IdealNonInvertingTransformers.txt | 4,739 | Aug. 16, 2004 | 11:42 AM |
| IdealResistor.txt | 5,317 | Jun. 28, 2004 | 06:56 AM |
| IdealResistors.txt | 4,258 | Jun. 28, 2004 | 06:56 AM |
| Inductor.txt | 5,679 | Jun. 28, 2004 | 06:56 AM |
| Inductors.txt | 4,720 | Jun. 28, 2004 | 06:57 AM |
| InvertingTransformer.txt | 7,416 | Jun. 28, 2004 | 06:57 AM |
| InvertingTransformers.txt | 4,911 | Jun. 28, 2004 | 06:57 AM |
| LISN50uH.txt | 6,232 | Jun. 28, 2004 | 06:57 AM |
| LISN5uH.txt | 6,376 | Jun. 28, 2004 | 06:57 AM |
| LISNs50uH.txt | 4,615 | Jun. 28, 2004 | 06:57 AM |
| LISNs5uH.txt | 648 | Nov. 4, 2003 | 12:25 PM |
| Materials.txt | 648 | Nov. 4, 2003 | 12:25 PM |
| Microstrip.txt | 6,716 | Jun. 28, 2004 | 06:57 AM |
| Microstrips.txt | 4,684 | Jun. 28, 2004 | 06:57 AM |
| modApplications.txt | 380,423 | Aug. 16, 2004 | 09:45 AM |
| modBranchImpedance.txt | 83,116 | Aug. 16, 2004 | 09:20 AM |
| modCableCalculations.txt | 50,216 | Aug. 15, 2004 | 11:07 AM |
| modCircuitImpedance.txt | 67,242 | Aug. 13, 2004 | 02:57 PM |
| modCollections.txt | 62,258 | Aug. 16, 2004 | 11:41 AM |
| modComplexMath.txt | 8,011 | Aug. 11, 2004 | 03:56 PM |
| modConstants.txt | 21,945 | Aug. 15, 2004 | 09:38 AM |
| modDrawElements.txt | 97,194 | Aug. 16, 2004 | 11:41 AM |
| modDrawLabels.txt | 41,739 | Aug. 16, 2004 | 11:41 AM |
| modErrorHandlers.txt | 5,412 | Jun. 16, 2004 | 03:15 AM |
| modFFT.txt | 8,225 | Jun. 15, 2004 | 03:13 AM |
| modFileReadWrite.txt | 10,572 | Aug. 16, 2004 | 11:41 AM |
| modFrequency.txt | 4,718 | Aug. 5, 2004 | 09:06 AM |
| modFunctions.txt | 42 | Jun. 17, 2004 | 06:42 AM |
| modGraphing.txt | 30,176 | Jul. 13, 2004 | 11:25 AM |
| modMenuFunctions.txt | 1,171 | Aug. 15, 2004 | 11:39 AM |
| modMiniNEC4EMI.txt | 188,906 | Aug. 16, 2004 | 06:55 AM |
| modMiscFunctions.txt | 20,407 | Aug. 16, 2004 | 11:41 AM |
| modOC_Color.txt | 13,664 | Jun. 15, 2004 | 03:13 AM |
| modPWBs.txt | 5,479 | Jul. 17, 2004 | 10:18 AM |
| modRSCalculations.txt | 56,495 | Aug. 16, 2004 | 05:27 AM |
| modStartup.txt | 1,089 | Aug. 15, 2004 | 02:24 PM |
| modSubroutines.txt | 7,537 | Aug. 16, 2004 | 11:41 AM |
| modToolbars.txt | 3,568 | Aug. 3, 2004 | 10:49 AM |
| modVariables.txt | 16,897 | Aug. 16, 2004 | 11:41 AM |
| NonInvertingTransformer.txt | 7,532 | Jun. 28, 2004 | 06:57 AM |
| NonInvertingTransformers.txt | 4,970 | Jun. 28, 2004 | 06:57 AM |
| oc_api.txt | 1,438 | Jun. 15, 2004 | 03:13 AM |
| Resistor.txt | 5,631 | Jun. 28, 2004 | 06:57 AM |
| Resistors.txt | 4,670 | Jun. 28, 2004 | 06:57 AM |
| Schematic.txt | 5,361 | Aug. 16, 2004 | 10:53 AM |
| Schematics.txt | 1,548 | Jun. 28, 2004 | 06:57 AM |
| Stage.txt | 9,168 | Aug. 16, 2004 | 09:12 AM |
| Stages.txt | 3,997 | Jun. 28, 2004 | 06:57 AM |
| Stripline.txt | 6,668 | Jun. 28, 2004 | 06:57 AM |
| Striplines.txt | 4,660 | Jun. 28, 2004 | 06:58 AM |
| Term50ohm.txt | 5,129 | Jun. 28, 2004 | 06:58 AM |
| Terms50ohm.txt | 4,188 | Jun. 28, 2004 | 06:58 AM |

BACKGROUND OF THE INVENTION

1. Field of Invention

The present invention relates to electromagnetic interference (EMI) prediction calculations for electric devices.

2. Prior Art

Regulatory agencies worldwide restrict radio frequency signals unintentionally conducted on power leads and interconnecting cable bundles by electric devices. Further, those agencies restrict electromagnetic field intensity unintentionally radiated by electric devices. Most regulatory agencies also require electric devices to withstand electromagnetically induced disturbances conducted on power lines and/or interconnecting cable bundles and incident upon the electric device as an electric or magnetic field. EMI requirements are regulated by numerous agencies from individual industries, countries, and combinations thereof. Requirements vary considerably across agencies and industries, but are applicable to nearly all electric, electrical, and electronic devices.

Compliance with EMI requirements is determined by testing the electric device. Testing is costly, as is redesign and retest if the device is found to be noncompliant. Analytical methods for predicting EMI performance are desirable but require knowledge in disparate intellectual disciplines heretofore not cost-effectively available to designers and manufacturers of electric devices.

Accordingly, it would be desirable to provide an apparatus that is capable of calculating electromagnetic emissions and susceptibility attributes of an electric device in four facets of EMI analysis: conducted emissions, conducted susceptibility, radiated emissions and radiated susceptibility. Such a device would overcome the limitations of the prior art which does not comprehensively address the subject of electromagnetic interference prediction.

It would further be desirable to provide an apparatus that allows for sources of electromagnetic interference, circuitry effect such as filtering and loading, interconnecting conductor configuration, conductor shielding, shield terminations, and a means for determining whether the device under analysis is predicted to comply with specified EMI requirements.

SUMMARY

The present invention is a method and apparatus for calculating electromagnetic emissions and susceptibility attributes of an electric device, comprising a simulation means for calculating conducted emissions, conducted susceptibility, radiated emissions, and radiated susceptibility. The method and apparatus comprise a means for simulating device active circuit signal attributes, a means for simulating device passive circuit electrical characteristics, a means for calculating device conductor electrical attributes, a means for calculating transfer impedance of device conductor shields, a means for calculating device conductor shield termination electrical attributes, and a means for comparing calculated attributes to prescribed values.

BRIEF DESCRIPTION OF THE DRAWINGS

FIG. 1 is a schematic diagram of the basic configuration of an electromagnetic emissions and susceptibility calculation system of the invention FIG. 2 shows the basic procedure for an electromagnetic emissions and susceptibility calculation algorithm of the invention.

FIGS. 3 and 4 show the configuration of major components for the emissions analysis model and susceptibility analysis model, respectively, of the invention.

FIG. 5 is a flow chart for defining time domain sources.

FIG. 6 is a flow chart for defining frequency domain sources.

FIG. 7 is a flow chart for performing circuit synthesis.

FIG. 8 is a flow chart for selecting conductor configuration and defining conductor characteristics.

FIG. 9 is a flow chart for performing analyses applicable to selected application.

FIG. 10 is a flow chart for defining limits.

FIG. 11 is a flow chart for creating circuits using schematic capture CAD methods.

FIG. 12 is a flow chart for calculating circuit transfer functions.

FIG. 13 is a flow chart for calculating shield transfer impedance.

FIG. 14 is a flow chart for calculating shield termination transfer functions.

FIG. 15 is a flow chart for calculating conductor transfer functions.

FIG. 16 is a flow chart for performing conducted emissions calculations.

FIG. 17 is a flow chart for performing radiated emissions calculations.

FIG. 18 is a flow chart for performing conducted susceptibility calculations.

FIG. 19 is a flow chart for performing radiated susceptibility calculations.

FIG. 20 is a flow chart for calculating parasitic element values.

DETAILED DESCRIPTION—PREFERRED EMBODIMENT

An electromagnetic emissions and susceptibility calculating device of the present embodiment calculates conducted emissions, conducted susceptibility, radiated emissions, and radiated susceptibility of an electric device to be analyzed.

The method and apparatus of the present invention as described herein is capable of being applied in an array of contexts as provided below and allows for the following advantages:

a. Provides a method and apparatus for predicting compliance with regulatory agency EMI requirements, thereby reducing the need for costly redesign and retest.
  b. Integrates methods for emissions and susceptibility calculations for conduction and radiation effects into a unified analysis platform.
  c. Provides comprehensive modeling of electric device circuits, wiring, and interference sources, including frequency domain sources, time domain waveforms, EMI filters, interconnecting conductor characteristics, circuit synthesis, including radio frequency circuit models, shield transfer impedance from shield construction details, shield termination impedance, conductor configurations (twisted pair, shielded, over ground plane, etc.), time domain and frequency domain limits for conducted and radiated emissions and susceptibility
  d. Provides an integrated platform, wherein an electric device is analyzed to predict performance for all four facets of electromagnetic interference, and its function and response directly compared to EMI performance standards imposed by regulatory agencies. The four areas of analysis comprise:
    1. Conducted Emissions—Calculation of differential mode and common mode current and voltage conducted on power lines and interconnecting cable bundle leads.
    2. Conducted Susceptibility—Calculation of induced effects of disturbances coupled to power lines and interconnecting cable bundles.
    3. Radiated Emissions—Calculation of electromagnetic fields emitted by changes in current on device power leads and interconnecting conductors.

4. Radiated Susceptibility—Calculation of induced effects of electromagnetic fields impinging on device conductors. Facilitates prediction for present and future regulatory agency EMI requirements.

e. Displays graphically and numerically, electrical characteristics of circuits, conductors, shields, sources, and limits, induced current and voltage, and emitted radiation fields and conducted current and voltage.

f. Calculates and displays current and voltage in each circuit branch and calculates and displays current on interconnecting conductors.

g. Calculates and displays shield transfer impedance from shield construction details and material properties.

h. Calculates and displays shield termination impedance.

i. Calculates stray capacitance and inductance of circuit interconnects, such as printed wiring boards, connectors, and discrete wiring.

As shown in FIG. 2, the electromagnetic emissions and susceptibility calculating device 1 comprises a data library unit 10 for retrieving and saving configuration and calculation data, an analysis selector unit 20 for user analysis selection, a time domain source calculating unit 30 for defining voltage and current sources as time varying waveforms, a frequency domain source calculating unit 40 for defining voltage and current sources and electromagnetic field levels as a function of frequency, a circuit synthesis unit 50 for defining circuits, a conductor configuration unit 60 for defining physical configuration of conductors and shields between interconnected circuits, an application calculator unit 70 for performing conducted emissions, conducted susceptibility, radiated emissions, and radiated susceptibility calculations on an electric device defined by selected sources, circuits, and conductors, a limit unit 75 for defining limits for data comparison, and a display unit 80 for displaying calculated data.

The data device library unit reads data from and stores data to selected storage media.

The analysis selector unit allows the user to select the type of analysis to be performed on the electric device and to configure analysis model parameters.

The time domain source unit allows the user to define time-domain voltage and current waveforms, display time-domain waveforms, convert time-domain waveforms to frequency domain spectrum using the Fast Fourier Transform method, display frequency-domain spectra, store and retrieve waveform parameters, and store and retrieve waveform values. The time domain source unit 30 shown in FIG. 5 comprises a waveform selection unit 300 for waveform selection, an input unit 310 for user data entry, a waveform synthesis unit 320 for calculating time-domain waveform values, a Fast Fourier Transform unit 330 for calculating frequency content of time-domain waveforms using Fast Fourier Transform method, a display unit 340 for graphing and tabulating waveform and frequency spectrum values, and a library unit 350 for storing and retrieving waveform parameters and calculated values.

The frequency domain source unit renders user-defined voltage, current, and electromagnetic field levels as a function of frequency. The frequency domain source unit allows the user to define spectral envelope, harmonic content, and frequency range, calculate amplitude over frequency, display amplitude values, and store and retrieve waypoints and calculated values. The frequency domain source unit 40 shown in FIG. 6 comprises an input unit 400 for user data entry of spectral envelope, harmonic content, frequency range, a calculating unit 410 for calculating amplitude values between defined waypoints, a display unit 420 for graphing or tabulating amplitude values, and a library unit 430 for storing and retrieving amplitude parameters and calculated values.

The circuit synthesis unit allows the user to graphically define electric circuits, edit electric circuits, calculate circuit transfer functions, display circuit transfer functions, and save and retrieve circuit configuration and component values. The circuit synthesis unit 50 shown in FIG. 7 comprises a schematic display unit 500 for displaying circuit schematic diagram, a schematic capture unit 510 that provides a graphical user interface for schematic diagram entry and editing, a transfer function calculating unit 520 for calculating circuit transfer functions, a transfer function display unit 530 for displaying circuit transfer functions, a library unit 540 for storing and retrieving circuit parameters and calculated transfer function values.

The schematic capture unit provides a graphic user interface that allows the user to create and edit schematic diagrams graphically. Circuit components are selected from a component library, assigned values, placed on the schematic diagram, and interconnected to other components. Components and their interconnections are translated into a circuit net list, from which circuit transfer function is calculated for subsequent display, storage, and retrieval. The schematic capture unit 510 shown in FIG. 11 comprises an action selector 5100 which allows user to insert, append, modify, or delete components from the circuit, a component selector 5110 for selecting a component on the schematic diagram, a component library 5120 from which the user selects circuit components, an input unit 5130 for user data entry of component element values, a graphing unit 5140 for displaying component electrical characteristics, a component placement unit 5150 for user graphical placement of components, an interconnect unit 5160 for interconnecting circuit components, a mapping unit 5170 for tracking component placement and interconnections, a library unit 5180 for storing and retrieving circuit parameters and calculated values, and a parasitic element calculating unit 5190 for calculating values of parasitic elements.

The circuit transfer function calculation unit calculates the complex impedance of the circuit components from a circuit net list. The circuit transfer function calculating unit 520 shown in FIG. 12 comprises a net list generator unit 5200 for translating the graphical schematic diagram into its numerical equivalent, a component impedance calculating unit 5210 for calculating the impedance of each component, a differential mode input impedance calculator 5220 for calculating differential mode impedance as seen from the circuit input terminals, a common mode input impedance calculator 5230 for calculating common mode impedance as seen from the circuit input terminals, a differential mode output impedance calculator 5240 for calculating differential mode impedance as seen from the circuit output terminals, a common mode output impedance calculator 5250 for calculating common mode impedance as seen from the circuit output terminals, a voltage transfer function calculator 5260 for calculating the voltage transfer function of the circuit, and a current transfer function calculator 5270 for calculating the current transfer function of the circuit.

The parasitic element calculating unit calculates inductance, capacitance, attenuation factor, propagation constant, impedance, and admittance of conductors. Whereas the value of these elements are typically considered insignificant compared to circuit element values at circuit operating frequencies they are often ignored in low frequency calculations and are considered to be parasitic. For EMI analysis, parasitic elements can have a significant effect on radio frequency device characteristics. The parasitic element calculating unit allows the user to define conductor parameters, initiate calculations, display calculated values, and store and retrieve parasitic element parameters and calculated values. Calculated parasitic values are used by the invention when performing calculations involving conductors. The parasitic element calculating unit 5190 shown in FIG. 20 comprises an input unit 51900 for user data entry of conductor dimensions, geometry, and materials, a parasitic element calculating unit 51910 for calculating parasitic element values from supplied parameters, a display unit 51920 for displaying calculated values, and a library unit 51930 for storing and retrieving parasitic element parameters and calculated values.

The conductor configuration unit allows the user to specify dimensional and material properties of conductors interconnecting device circuits. The conductor configuration unit 60 shown in FIG. 8 comprises a configuration selector unit 600 for user selection of conductor configuration, an input unit 610 for user entry of physical conductor parameters, a shield transfer impedance calculating unit 620 for calculating shield transfer impedance, a shield termination calculating unit 630 for calculating shield termination impedance, a conductor transfer function calculating unit 640 for calculating conductor electrical characteristics, and a library unit 650 for storing and retrieving conductor parameters and calculated values.

The shield transfer impedance calculating unit calculates shield transfer impedance from dimensional and material properties entered by the user. The shield transfer impedance calculating unit allows the user to define shield parameters, initiate shield transfer impedance calculations, display calculated transfer impedance, and store and retrieve shield parameters and calculated transfer impedance. The shield transfer impedance calculating unit 620 shown in FIG. 13 comprises an input unit 6200 for user data entry of shield dimensions, construction, and materials, a transfer impedance calculating unit 6210 for calculating shield transfer impedance from supplied parameters, a display unit 6220 for displaying calculated graphical or numerical shield transfer impedance data, and a library unit 6230 for storing and retrieving shield transfer impedance parameters and calculated values The shield termination calculating unit calculates complex impedance of shield terminations from dimensional and physical data entered by the user. The shield termination calculating unit allows the user to define shield termination parameters, facilitate shield termination impedance calculations, display calculated impedance, and store and retrieve shield termination parameters and calculated shield termination impedance values. Calculated shield termination impedance values are used by the invention when performing calculations involving shielded conductors. The shield termination calculating unit 630 shown in FIG. 14 comprises a termination selector unit 6300 for user selection of shield termination method, an input unit 6310 for user data entry of shield termination dimensions, construction, material properties, etc., a shield termination impedance calculating unit 6320 for calculating shield termination impedance from supplied parameters, a display unit 6330 for displaying graphical and numerical shield termination impedance data, and a library unit 6340 for storing and retrieving shield transfer impedance parameters and calculated values.

The conductor transfer function calculating unit calculates characteristics such as impedance, admittance, and distributed capacitance and inductance of interconnecting conductors from dimensional and material values entered by the user. The conductor transfer function calculating unit allows the user to calculate conductor characteristics, display calculated characteristics, and store and retrieve conductor parameters and calculated characteristics. Calculated characteristics are used by the invention when performing calculations involving interconnecting conductors. The conductor transfer function calculating unit 640 shown in FIG. 15 comprises an input unit 6400 for user data entry, a characteristic calculating unit 6410 for calculating conductor characteristics from dimensional and physical parameters, a display unit 6420 for displaying graphical and numerical conductor characteristics data, and a library unit 6430 for storing and retrieving conductor parameters and calculated values.

The limit unit renders user-defined voltage, current, and electromagnetic field limits as a function of time or frequency. The time domain limit unit allows the user to define a limit in the time domain by entering amplitude/time waypoints, calculate the limit envelope at time intervals between waypoints, display the limit, and store and retrieve waypoints and calculated values. The frequency domain limit unit allows the user to define a limit in the frequency domain by entering amplitude/frequency waypoints, calculate the limit envelope over frequencies between waypoints, display the limit, and store and retrieve waypoints and calculated values. The limit unit 75 shown in FIG. 10 comprises an input unit 7510 for user data entry of amplitude/time waypoints or amplitude/frequency waypoints, an input 7520 for user entry of units, labels, etc., a calculating unit 7530 for calculating amplitude values between defined waypoints, a display unit 7540 for graphing or tabulating limit amplitude values versus time or frequency, and a library unit 7550 for storing and retrieving limit waypoints and calculated values.

The application calculating unit calculates interference produced by sources within the device under analysis (for emissions) and induced voltage and current resulting from sources applied to the device under analysis (for susceptibility). The application calculating unit 70 shown in FIG. 9 comprises a conducted emissions calculating unit 710 for calculating conducted emissions in the time domain or as a function of frequency, a radiated emissions calculating unit 720 for calculating radiated emissions in the time domain or as a function of frequency, a conducted susceptibility calculating unit 730 for calculating conducted susceptibility in the time domain or as a function of frequency, a radiated susceptibility calculating unit 740 for calculating radiated susceptibility in the time domain or as a function of frequency, a display unit 750 for displaying graphical or numerical calculated values, and a library unit 760 for storing and retrieving setup parameters and calculated data.

The conducted emissions calculating unit calculates common mode and differential mode current produced by electric circuit operation. Calculations incorporate user-defined and calculated values for sources, filtering, circuit impedance, conductor configuration, shield construction, and shield terminations. The conducted emissions calculating unit 710 shown in FIG. 16 comprises a frequency/time incrementing unit 7100 for incrementing frequency or time, a source application unit 7110 for applying voltage or current from time domain source 30 or frequency domain source 40 to the source side of Circuit A, a circuit calculating unit 7120 for calculating voltage and current in each branch of Circuit A, a conductor calculating unit 7130 for calculating voltage and current on each conductor, a circuit calculating unit 7140 for calculating voltage and current in each branch of Circuit B, and a display unit 7150 for displaying graphical or numerical conducted emissions calculations data.

The conducted susceptibility calculating unit calculates induced effects of signals coupled to conductors interconnecting electric circuits. Current and voltage induced in circuit elements at each end of the conductors are calculated and displayed. Calculations incorporate user-defined and calculated values for conductor dimensions, conductor configuration, coupled signal characteristics, coupling mechanisms, circuit impedance, shield construction, and shield termination to calculate voltage and current induced in circuit elements. The conducted susceptibility calculating unit 730 shown in FIG. 18 comprises a frequency/time incrementing unit 7300 for incrementing frequency or time, a source application unit 7310 for applying voltage or current from time domain source 30 or frequency domain source 40 to the interconnecting conductors, a conductor calculating unit 7320 for calculating voltage and current induced on each conductor, a circuit calculating unit 7330 for calculating voltage and current in each branch of Circuit A, a circuit calculating unit 7340 for calculating voltage and current in each branch of Circuit B, and a display unit 7350 for displaying graphical or numerical conducted susceptibility calculation data.

The radiated emissions calculating unit calculates field strength generated by current flowing on conductors interconnecting electric circuits. Calculations incorporate user-defined and calculated values for sources, filtering, circuit impedance, conductor configuration, shield construction, and shield terminations to calculate radiated emissions produced by interconnecting conductors.

The radiated emissions calculating unit 720 shown in FIG. 17 comprises a frequency/time incrementing unit 7200 for incrementing frequency or time, a source application unit 7210 for applying voltage or current from time domain source 30 or frequency domain source 40 to the source side of Circuit A, a circuit calculating unit 7220 for calculating voltage and current in each branch of Circuit A, a conductor calculating unit 7230 for calculating voltage and current on each conductor, a circuit calculating unit 7240 for calculating voltage and current in each branch of Circuit B, a radiation calculating unit 7250 for calculating field level generated by conductor current, and a display unit 7260 for displaying graphical or numerical radiated emissions calculations data.

The radiated susceptibility calculating unit calculates current and voltage induced in device circuits by an electromagnetic field impinging on conductors interconnecting electric circuits. Current induced on interconnecting conductors is calculated over a user-specified frequency range. Current and voltage induced in circuit elements at each end of the conductors are calculated and displayed. Calculations incorporate user-defined and calculated values for conductor dimensions, conductor configuration, incident field orientation, field strength, circuit impedance, shield construction, and shield termination to calculate voltage and current induced in circuit elements.

The radiated susceptibility calculating unit 740 shown in FIG. 19 comprises a frequency/time incrementing unit 7400 for incrementing frequency or time, a field application unit 7410 for applying electromagnetic fields to the interconnecting conductors, a conductor calculating unit 7420 for calculating voltage and current induced on each conductor, a circuit calculating unit 7430 for calculating voltage and current in each branch of Circuit A, a circuit calculating unit 7440 for calculating voltage and current in each branch of Circuit B, and a display unit 7450 for displaying graphical or numerical radiated susceptibility calculations data.

DETAILED DESCRIPTION—OPERATION OF INVENTION

Electromagnetic emissions and susceptibility analyses are accomplished by applying circuit theory and field theory to mathematical models of the electric device under investigation. The mathematical models are derived from schematic diagrams of the electric circuits and equivalent circuit representations of interconnecting conductors.

The preferred embodiment of the present invention comprises four analysis applications: conducted emissions, radiated emissions, conducted susceptibility, and radiated susceptibility.

Each model consists of two electric circuits, interconnected by conductors and stimulated by one or more sources. For conducted emissions and radiated emissions analyses the sources simulate characteristics of active circuitry within the electric device, and are located such that Circuit A lies between the source and the interconnecting conductors. For conducted susceptibility analyses a single source is positioned between Circuit A and the interconnecting conductors. For radiated susceptibility, the source is an electromagnetic field that impinges on the interconnecting conductors.

The user defines a time domain source by entering parameter values that define the shape, amplitude, duration, frequency, and units of its waveform. The time domain source unit 30 calculates the source amplitude at prescribed time increments and displays the waveform. The time domain waveform is translated to its frequency domain equivalent using the Fast Fourier Transform method.

For conducted emissions and radiated emissions analysis a time domain source is any component within the electric device under investigation whose voltage or current changes over time. Examples are digital semiconductors, relays, oscillators, switch mode power converters, amplifier circuits, and switches.

For conducted susceptibility and radiated susceptibility analysis a time domain source is any time varying current, voltage, or electromagnetic field that can be coupled to the interconnecting conductors between Circuit A and Circuit B. Time domain waveforms are displayed to the user graphically or as numerical values. Input parameters and calculated values are stored for subsequent use by other calculating units and become a part of the user's source library.

A frequency domain source is defined by the user in one of two ways. (1) The user enters parameter values that define the source spectral envelope, i.e., frequency range, amplitude/frequency waypoints, spectral spacing, and units (current, voltage, or field strength). The frequency domain source unit 40 calculates the source amplitude at prescribed frequencies between waypoints and displays the spectrum. (2) The user enters parameter values that define the source time domain waveform. The frequency domain source unit 40 uses the Fourier Transform method to calculate the frequency domain spectrum.

For conducted emissions and radiated emissions analysis a frequency domain source is any component within the electric device under investigation whose voltage or current can be represented by a frequency spectrum. Examples are digital semiconductors, oscillators, amplifiers, and switch mode power converters.

For conducted susceptibility and radiated susceptibility analysis a frequency domain source is any current, voltage, or electromagnetic field that can be coupled to the interconnecting conductors between Circuit A and Circuit B.

Frequency domain spectra are displayed to the user graphically or as numerical values. Input parameters and calculated values are stored for subsequent use by other calculating units and become a part of the user's source library.

Circuit models are created by the user by interconnecting components selected from the component library to create a schematic diagram. Using CAD methods components are graphically placed and interconnected such that the circuit under analysis is modeled. Element values are assigned by the user.

For conducted emissions and radiated emissions analysis Circuit A comprises circuitry that is connected between the source and the interconnecting conductors. Circuit B comprises circuitry that lies on the opposite end of the interconnecting conductors from Circuit A as shown in FIG. 3. For conducted susceptibility and radiated susceptibility Circuit A comprises circuitry that is connected to the source end of the interconnecting conductors, while Circuit B comprises circuitry that is connected to the opposite end of the interconnecting conductors as shown in FIG. 4.

Circuit A and Circuit B are modeled as passive components whose values are selected to replicate the radio frequency characteristics of Circuit A and Circuit B, respectively, over the time interval or frequency range of interest. In the device under investigation Circuit A and Circuit B may consist of semiconductors, EMI filter components, printed wiring board lands, interconnect wires, connectors, or any other electrical components. In addition to displaying the circuits as schematic diagrams, the present invention displays the impedance of each circuit, and displays current through and voltage across each branch of each circuit when interconnected and supplied with a source. The user may thereby examine the performance of the circuit to determine the effect of each component in the subject analysis. Calculated values are displayed graphically or as numerical values. Circuit component values and calculated characteristics are stored for subsequent use by other calculating units and become a part of the user's circuit library.

The user synthesizes a schematic diagram of the circuit under analysis by graphically placing and interconnecting components selected from the component library. The schematic capture unit 510 allows components to be added, edited, appended, and deleted as required to model the circuit.

The component library is a repository of components that schematically describe electric devices found in circuits. Library components consist of one or more elements. Elements are fundamental circuit building blocks such as capacitors, inductors, and resistors. Element values are set by the user.

Component placement, element values, and interconnects are tracked and mapped for subsequent use by the schematic display unit and transfer function unit.

The transfer function unit 520 translates the graphical schematic diagram into a mathematical model. Circuit transfer functions such as input impedance, resonance, damping, and phase shift are then calculated and displayed.

The parasitic elements calculating unit 5190 is a tool for calculating element values of interconnecting conductors. Inductance, resistance, and capacitance are natural byproducts of physical circuit interconnections, such as printed circuit boards, wires, connectors, etc. The parasitic elements calculating unit provides common interconnect configurations and allows the user to enter dimensional and material properties. The parasitic elements calculating unit returns calculated values for inductance, capacitance, resistance, and characteristic impedance. These values can then be transferred to schematic diagram elements, thus allowing subtle aspects of the circuit under investigation to be modeled.

Circuits are interconnected by conductors. At the frequencies of interest for EMI interconnecting conductors are a significant constituent of the electric device model, providing a medium for interference produced by one circuit to conduct to another or radiate to the environment. Simultaneously interconnecting conductors are a medium through which interference can be conducted into a circuit either directly from the circuit to which it is interconnected or indirectly via capacitive or inductive coupling from adjacent conductors or from electromagnetic fields impinging on the conductor.

The role of the interconnecting conductors depends on the type of analysis undertaken. For conducted emissions analyses the interconnecting conductors are the path by which conducted emissions flow between Circuit A and Circuit B. For radiated emissions the interconnecting conductors are the radiator through which radiation producing current flows. For conducted susceptibility analysis the interconnecting conductors are the medium into which interfering current and voltage waveforms are coupled. For radiated susceptibility the interconnecting conductors are the receptors into which current is induced by the incident electromagnetic field.

The interconnecting conductors consist of printed wiring board lands or circular wires and may be configured as a conductor pair, a conductor over a ground plane, or conductors in a shield. The present invention displays the impedance of the interconnecting conductors as seen from the conductor terminals, and displays current through and voltage across and between the conductors when Circuit A and Circuit B are attached to opposite ends of the conductors. The user can thereby examine the effect of the conductors in a given application to determine the effect of each conductor parameter in the analysis. Calculated values are displayed graphically or numerically. Conductor parameters and calculated characteristics are stored for subsequent use by other calculating units and become a part of the user's conductor library.

The user selects from a library of conductor configurations the configuration that best simulates the physical arrangement of the conductor in the electric device. Conductor configurations include shielded conductors, unshielded conductors, paired conductors, and conductors over a ground plane.

Shield transfer impedance defines the voltage induced on conductors within the shield when current flows on the shield. It is the figure of merit that determines how well a shield performs over the frequency range of interest. Most conductor shields are constructed by weaving small gauge circular wires into a tubular shape. At low frequencies, shield conductivity and thickness determine transfer impedance. At higher frequencies other parameters, such as permeability, optical coverage, and aperture size predominate. The user specifies the physical construction details of the shield and the material properties of the shield constituents. The shield transfer impedance is then calculated and displayed. Calculated values are stored for later use in calculations involving shielded conductors and become a part of the user's shield library.

Shield termination impedance has a significant effect on how well a conductor shield performs at high frequencies. Generally, higher termination impedance results in lower shielding effectiveness.

The user selects a termination method from the termination library and assigns physical dimensions and material properties to the termination. The termination impedance is calculated and displayed. Termination impedance is stored for use in subsequent calculations involving shielded conductors and becomes a part of the user's shield termination library.

At the frequencies of interest for EMI analysis the dimensions of interconnecting conductors are often significant with respect to the wavelength of the current flowing on them. Conductor electrical characteristics such as characteristic impedance, self inductance, mutual inductance, and stray capacitance are significant.

The user specifies dimensional and material properties of the interconnecting conductors. The conductor characteristics are calculated and displayed. Values are stored for use in calculations involving interconnecting conductors and become a part of the user's interconnecting conductor library.

EMI limits are imposed on electric devices by regulatory agencies such as the Federal Communications Commission, Federal Aviation Administration, Department of Defense, European Committee for Electrotechnical Standardization, or other governing bodies. Limits may also be self-imposed for system self-compatibility or any other reason.

Emissions limits define the level of radio frequency conducted current, voltage or radiation a device may produce. If emissions exceed the applicable emissions limit the device is said to be noncompliant. Limits are used in conducted emissions and radiated emissions analyses to assess whether calculated values exceed predefined amplitudes. Emissions limits are graphically or numerically superimposed over calculated values for comparison to provide the user with predictions about the performance of the device under investigation, and whether it is likely to comply with applicable limits imposed by the regulatory agency or governing body.

Susceptibility limits define the level of conducted or radiated interference in which a device must function. Susceptibility limits define continuous and transient levels of interference. The operation of the device and its allowable response to the source of interference depends on the device and its intended use. Susceptibility limits are used to predict the tolerable level of current or voltage induced in the device circuits.

Limits are defined graphically by a line, sometimes discontinuous, that extends over a time interval or frequency range. An equivalent limit is readily defined numerically at discrete times or frequencies. Amplitude is commonly in units of current, voltage, or field strength, but may be any suitable metric.

A time domain limit defines amplitude over a time interval. Time/amplitude waypoints entered by the user, when sequentially connected, create a limit envelope. Time domain limits are stored for use in subsequent analyses where a limit overlay is selected, and become a part of the user's limit library.

Frequency domain limits define amplitude over a frequency range. Frequency/amplitude waypoints entered by the user, when sequentially connected, create a limit envelope. Frequency domain limits are stored for use in subsequent analyses where a limit overlay is selected, and become a part of the user's limit library.

The preferred embodiment of the present invention provides a unified platform across which the EMI performance of an electric device is analyzed. Having specified the source characteristics, circuits, and interconnecting conductors, calculations are performed to predict conducted emissions, conducted susceptibility, radiated emissions, and radiated susceptibility performance of the electric device.

By adjusting the source characteristics using the Time Domain Source Unit 30 and the Frequency Domain Source Unit 40, the performance of the electric device under investigation is readily analyzed for emissions and susceptibility requirements.

Conducted emissions are defined as radio frequency current and voltage conducted by an electric device on its power leads or interconnecting signal leads. Conducted emissions produced by electric devices are limited by various regulatory agencies and therefore must be controlled. Conducted emissions are most commonly measured by placing a current probe around one or more conductors connected to the device and measuring current as a function of frequency or time, or by measuring the voltage developed across a known impedance (such as a Line Impedance Stabilization Network) as a function of frequency or time.

Current and voltage on the interconnecting conductors are the desired metrics for conducted emissions calculations. The present invention calculates and displays conductor current and voltage in a manner that can be directly compared with conducted emissions limits, either by displaying calculated conducted emissions graphically or numerically. A conducted emissions limit may be superimposed on the calculated values for comparison, thereby providing the user a prediction of whether the device under investigation complies with applicable conducted emissions limits.

Conducted emissions are calculated as follows: User selects conducted emissions analysis using analysis selector 20. User inputs source characteristics using time domain source 30 or frequency domain source 40. User inputs Circuit A using schematic capture unit 510 and parasitic element calculating unit 5190. Circuit A transfer functions are calculated using circuit transfer function unit 520. User selects a conductor configuration from conductor configuration unit 60 and inputs conductor parameters using input unit 610. If the conductors are shielded, shield parameters are entered and characteristics calculated using shield transfer unit 620 and shield termination unit 630. Conductor characteristics are calculated using conductor transfer function calculating unit 640. User inputs Circuit B characteristics using schematic capture unit 510 and parasitic element calculating unit 5190. Circuit B transfer functions are calculated using circuit transfer function unit 520. Conducted emissions are calculated using conducted emissions calculating unit 710. Results are displayed, printed, or stored using library unit 760. User inputs a conducted emissions limit using the limit unit 75 and graphically overlays or numerically compares the limit to calculated conducted emissions. As desired source, circuit, and conductor parameters are adjusted and conducted emissions recalculated until predicted values are within conducted emissions limits or until suitable performance is achieved.

Radiated emissions are electromagnetic fields produced by time varying current flowing on a conductor. Radiated emissions produced by electric devices are limited by various regulatory agencies and therefore must be controlled. Radiated emissions are most commonly measured by placing a measurement antenna a known distance from the device under test and measuring the signal received as a function of time or frequency.

Electric field strength radiated from the interconnecting conductors is the desired metric for radiated emissions calculations. The present invention calculates and displays electric field values in a manner that can be directly compared with radiated emissions limits, either by displaying calculated radiated emissions graphically or numerically. A radiated emissions limit may be superimposed on the calculated values for comparison, thereby providing the user a prediction of whether the device under investigation complies with applicable radiated emissions limits.

Radiated emissions are calculated as follows: User selects radiated emissions analysis using analysis selector 20. User inputs source characteristics using time domain source 30 or frequency domain source 40. User inputs Circuit A using schematic capture unit 510 and parasitic element calculating unit 5190. Circuit A transfer functions are calculated using circuit transfer function unit 520. User selects a conductor configuration from conductor configuration unit 60 and inputs conductor parameters using input unit 610. If the conductors are shielded, shield parameters are entered and characteristics calculated using shield transfer unit 620 and shield termination unit 630. Conductor characteristics are calculated using conductor transfer function calculating unit 640. User inputs Circuit B characteristics using schematic capture unit 510 and parasitic element calculating unit 5190. Circuit B transfer functions are calculated using circuit transfer function unit 520. Radiated emissions are calculated using radiated emissions calculating unit 720. Results are displayed, printed, or stored using library unit 760. User inputs radiated emissions limit using the limit unit 75 and graphically overlays or numerically compares the limit to calculated radiated emissions. As desired source, circuit, and conductor parameters are adjusted and radiated emissions recalculated until predicted values are within radiated emissions limits or until suitable performance is achieved.

Conducted susceptibility is a determination of induced current or voltage in a circuit subjected to current or voltage coupled to power leads or interconnecting signal leads. Conducted susceptibility threats simulate the induced effects of transients, surges, oscillations, variations, perturbations, etc. likely to be present on conductors connected to electric circuits. Conducted susceptibility is most commonly determined by capacitively or inductively coupling a current or voltage waveform to conductors connected to the device under test and measuring the response of the device.

The susceptibility of the circuit or device is a function of numerous variables and must be established by the user. The present invention calculates and displays induced circuit current and voltage values in a manner that can be directly compared with user defined limits by displaying calculated induced current or voltage graphically or numerically. A conducted susceptibility limit may be superimposed on the calculated values for comparison, thereby providing the user a prediction of whether the device under investigation will comply with applicable conducted susceptibility limits.

Conducted susceptibility values are calculated as follows: User selects conducted susceptibility analysis using analysis selector 20. User inputs conduction source characteristics using time domain source 30 or frequency domain source 40. User inputs Circuit A using schematic capture unit 510 and parasitic element calculating unit 5190. Circuit A transfer functions are calculated using circuit transfer function unit 520. User selects a conductor configuration from conductor configuration unit 60 and inputs conductor parameters using input unit 610. If the conductors are shielded, shield parameters are entered and characteristics calculated using shield transfer unit 620 and shield termination unit 630. Conductor characteristics are calculated using conductor transfer function calculating unit 640. User inputs Circuit B characteristics using schematic capture unit 510 and parasitic element calculating unit 5190. Circuit B transfer functions are calculated using circuit transfer function unit 520. Induced current or voltage is calculated using conducted susceptibility calculating unit 730. Results are displayed, printed, or stored using library unit 760. User inputs a conducted susceptibility limit using the limit unit 75 and graphically overlays or numerically compares the limit to calculated induced current or voltage. As desired source, circuit, and conductor parameters are adjusted and induced current or voltage recalculated until predicted values are within conducted susceptibility limits or until suitable performance is achieved.

Radiated susceptibility is a determination of induced current or voltage in a circuit when its power leads or interconnecting signal conductors are subjected to an electromagnetic field. Radiated susceptibility threats simulate the world wide electromagnetic environment. Radiated susceptibility is most commonly determined by subjecting the device under test and its interconnecting cabling to an electromagnetic field having known amplitude and modulation characteristics and measuring the response of the device.

The susceptibility of the circuit or device is a function of numerous variables and must be established by the user. The present invention calculates and displays induced circuit current and voltage values in a manner that can be directly compared with user defined limits, either by displaying calculated induced current or voltage graphically or numerically. A radiated susceptibility limit may be superimposed over calculated values for comparison, thereby giving the user a prediction of whether the device under investigation will comply with applicable radiated susceptibility limits.

Radiated susceptibility values are calculated as follows: User selects radiated susceptibility analysis using analysis selector 20. User inputs radiation source characteristics using time domain source 30 or frequency domain source 40. User inputs Circuit A using schematic capture unit 510 and parasitic element calculating unit 5190. Circuit A transfer functions are calculated using circuit transfer function unit 520. User selects a conductor configuration from conductor configuration unit 60 and inputs conductor parameters using input unit 610. If the conductors are shielded, shield parameters are entered and characteristics calculated using shield transfer unit 620 and shield termination unit 630. Conductor characteristics are calculated using conductor transfer function calculating unit 640. User inputs Circuit B characteristics using schematic capture unit 510 and parasitic element calculating unit 5190. Circuit B transfer functions are calculated using circuit transfer function unit 520. Induced current or voltage is calculated using radiated susceptibility calculating unit 740. Results are displayed, printed, or stored using library unit 760. User inputs a radiated susceptibility limit using the limit unit 75 and graphically overlays or numerically compares the limit to calculated conducted emissions. As desired source, circuit, and conductor parameters are adjusted and induced current or voltage recalculated until predicted values are within conducted susceptibility limits or until suitable performance is achieved.

DETAILED DESCRIPTION—DESCRIPTION AND OPERATION OF ALTERNATIVE EMBODIMENTS

An alternative embodiment of the present invention performs calculations simulating tests specified by regulatory agencies or governing bodies. Test requirements published by regulatory agencies and other governing bodies define test setups, waveforms, methods, limits, evaluation criteria, and operating conditions to which a device must be subjected. The results of analyses described in the preferred embodiment of the present invention may be further processed to determine compliance with requirements. Examples of specified requirements include, but are not limited to audio frequency conducted emissions, radio frequency conducted emissions, transient conducted emissions, inrush current, turn-on and turn-off voltage transients, audio frequency conducted susceptibility, radio frequency conducted susceptibility, electrical fast transients, lightning indirect effects, power surges, electrostatic discharge, radiated emissions, transient electromagnetic field emissions, electromagnetic pulse, continuous radiated susceptibility, spread spectrum effects, modulation effects, transient radiated susceptibility. Analyses are performed by applying requirements specified by the regulatory agency or governing body to the device under investigation using the preferred embodiment of the present invention.

An alternative embodiment of the present invention calculates filter insertion loss for the device under analysis. The results of analyses described in the preferred embodiment of the present invention may be further processed to determine filter insertion loss. Filter insertion loss is a measure of voltage or current reduction provided by circuit components in an electric device. Filter insertion loss calculations are applicable to conducted emissions, radiated emissions, conducted susceptibility, and radiated susceptibility analyses. Filter insertion loss calculated using the present embodiment is advantageous because it yields the actual effectiveness of filter components in the device under investigation. Filter insertion loss is traditionally specified for standardized impedance, i.e., with 50 ohm source and load impedance, which may be quite different than the circuit impedance. As a result, filter insertion loss in the device may be substantially different than specified filter insertion loss. Filter insertion loss is computed by first calculating device performance without the filter components in place, then calculating device performance with filter components in place, keeping other analysis variables constant. The two sets of calculated values are then used to calculate filter insertion loss. Filter insertion loss is calculated by subtracting or dividing values calculated at each time interval or frequency. If values are expressed in logarithmic units, e.g., decibels, filter insertion loss is the difference between values returned for the filtered circuit and values returned for unfiltered circuit. If values are expressed in linear units, e.g., volts, amperes, volts/meter, filter insertion loss is the quotient of values returned for the filtered circuit divided by values returned for the unfiltered circuit.

An alternative embodiment of the present invention calculates a transfer function relating conducted emissions to radiated emissions. The results of analyses described in the preferred embodiment of the present invention may be further processed to determine the transfer function between conducted emissions and radiated emissions. The transfer function is device dependent and configuration dependent. Radiated emissions are produced by conducted emissions on interconnecting cables and power leads connected to an electric device. It is therefore possible to calculate a transfer function expressing radiated emissions in terms of conducted emissions or vise versa. A conducted emissions limit derived from the radiated emissions limit is advantageous because conducted emissions are more readily measured in an electronics laboratory environment than are radiated emissions. Radiated emissions measurements require a shielded, preferably anechoic, chamber or open area test site having a low ambient background. Conducted emissions measurements do not require a shielded enclosure or low ambient background. Radiated emissions are calculated by first calculating conducted emission on a conductor, then applying field theory to the conductor current to determine the field produced. Having calculated radiated emissions for an electric device, a transfer function relating radiated emissions to conducted emissions is derived by dividing calculated field amplitude by calculated conductor current amplitude at each time interval or frequency. When the resulting transfer function is multiplied by field levels defining a radiated emissions limit, an equivalent conducted emissions limit is attained.

An alternative embodiment of the present invention calculates shielding effectiveness of braided cable shields. The results of analyses described in the preferred embodiment of the present invention may be further processed to determine cable shield shielding effectiveness. Cable shield shielding effectiveness calculations are applicable to conducted emissions, radiated emissions, conducted susceptibility, and radiated susceptibility analyses. Cable shield shielding effectiveness is computed by first calculating device performance with cable shields, then calculating device performance without cable shields, keeping other analysis variables constant. The two sets of calculated values are then used to calculate the shielding effectiveness. Shielding effectiveness is calculated by subtracting or dividing values calculated at each time interval or frequency. If values are expressed in logarithmic units, e.g., decibels, shielding effectiveness is the difference between values returned for unshielded conductors and values returned for shielded conductors. If values are expressed in linear units, e.g., volts, amperes, volts/meter, shielding effectiveness is the quotient of values returned for unshielded conductors divided by values returned for shielded conductors.

CONCLUSION

The present invention provides an integrated platform, wherein an electric device can be analyzed to predict performance for all four facets of electromagnetic interference, and its function and response directly compared to performance standards establish by regulatory agencies and other governing bodies. An electric device can be analyzed for conducted emissions, conducted susceptibility, radiated emissions, and radiated susceptibility, considering relevant device characteristics including active circuits, passive components, conductor configuration, shield construction, shield terminations, interconnected circuit characteristics, and characteristics of coupled fields and signals.

The present invention provides for analytical evaluation of the EMI performance of an electric device, prior to testing, thereby providing a means for improving EMI control methods, reducing EMI test costs, and reducing device redesign and retest.

Alternative embodiments of the present invention comprise several items of value to electric device designers, including EMI filter insertion loss, conducted emissions/radiated emissions transfer function, cable shielding effectiveness. Furthermore, alternative embodiments of the present invention comprise calculations simulating tests specified by regulatory agencies or governing bodies.

The invention claimed is:

1. An electromagnetic interference calculation device for calculating electromagnetic emissions and susceptibility attributes of an electric device, comprising:
a memory which stores input data entered by a user of electromagnetic field emissions and measurements and calculated data corresponding to the voltage and current induced by an electric device,
an input means for entering description and simulation parameters entered by a user of electromagnetic field emissions and measurements,
a description means for specifying the parameters of said electric device,
a simulation means for calculating electromagnetic emissions and susceptibility attributes of said electric device,
a display means which is operatively connected to said memory for displaying said electric device parameters, said simulation parameters, and said calculated electromagnetic emissions and susceptibility attributes,
whereby an electric device is specified and electromagnetic emissions and susceptibility attributes of said electric device are calculated and displayed.

2. The electromagnetic interference calculation device according to claim 1, further comprising a specification means for specifying device active circuit signal attributes, comprising:
a translation means for translating said electric device parameters to an equivalent time-domain waveform,
a transform means for transforming said equivalent time-domain waveform to a frequency-domain equivalent using the Fast Fourier Transform method,
whereby said device active circuit attributes are translated to an equivalent time-domain waveform and transformed to an equivalent frequency-domain spectrum.

3. The electromagnetic interference calculation device according to claim 1, further comprising a specification means for specifying device passive circuit electrical characteristics, comprising:
a drawing means for drawing said device passive circuits as schematic diagrams using CAD methods,
a translation means for translating said schematic diagrams into equivalent circuit representations,
a calculation means for calculating circuit electrical attributes from said equivalent circuit representations, whereby said device passive circuits are drawn using CAD methods and electrical attributes calculated from translated equivalent circuit data.

4. The electromagnetic interference calculation device according to claim 1, further comprising a calculation means for calculating an electric device conductor electrical attributes, comprising:
a translation means for translating said electric device conductor electrical attributes physical parameters into equivalent circuit representations,
a calculation means for calculating electrical characteristics of said electric device conductors electrical attributes from said equivalent circuit representations, whereby said device conductor physical parameters are translated to equivalent circuit electrical characteristics.

5. The electromagnetic interference calculation device according to claim 1, further comprising a calculation means for calculating transfer impedance of said electrical device conductor electrical attributes shields, comprising:
a calculation means for calculating shield transfer impedance from the physical parameters of said electrical device conductor electrical attributes shield,
whereby shield transfer impedance of said electrical device conductor electrical attributes shields is calculated.

6. The electromagnetic interference calculation device according to claim 1, further comprising a calculation means for calculating the shield termination of said electrical device conductor electrical attributes shield, comprising:
a translation means for translating the physical parameters of said shield termination of said electrical device conductor electrical attributes into equivalent circuit representations,
a calculation means for calculating electrical characteristics of said shield terminations of said electrical device conductor electrical attributes from said equivalent circuit representations, whereby said shield terminations of said electrical device conductor electrical attributes physical parameters are translated to equivalent circuit electrical characteristics.

7. The electromagnetic interference calculation device according to claim 1, further comprising a comparison means for comparing calculated attributes to prescribed values entered by a user relating to an electromagnetic field, comprising:
an input means for entering said prescribed values at prescribed intervals,
a graphical or numerical comparison means
whereby calculated attributes of said electric device are compared to prescribed values.

8. The electromagnetic interference calculation device according to claim 1, wherein said simulation means comprises a calculation means for calculating signals emitted on a device conductor, comprising:
a specification means for specifying device active circuit signal attributes,
a specification means for specifying device passive circuit electrical characteristics,
a calculation means for calculating device conductor electrical attributes,
a calculation means for calculating device conductor shield attributes,
whereby conducted emissions produced by said electric device are calculated and displayed.

9. The electromagnetic interference calculation device according to claim 1, wherein said simulation means comprises a calculation means for calculating signals induced in device circuits by externally generated signals coupled to device conductors, comprising:
a specification means for specifying externally generated signal characteristics,
a simulation means for calculating coupling from said externally generated signals to said device conductors,
a calculation means for calculating induced signal levels in said device circuits,
whereby said device susceptibility attributes to said externally generated signals coupled to said electric device conductors are calculated and displayed.

10. The electromagnetic interference calculation device according to claim 1, wherein said simulation means comprises a calculation means for calculating fields emitted from at least one device conductor, comprising:
a specification means for specifying device active circuit signal attributes, a specification means for specifying device passive circuit electrical characteristics, a calculation means for calculating device conductor electrical attributes, a calculation means for calculating device conductor shield attributes, a calculation means for calculating fields produced by signals on said device conductors, whereby, radiated emissions produced by said device conductors are calculated and displayed.

11. The electromagnetic interference calculation device according to claim 1, wherein said simulation means comprises a calculation means for calculating signals induced in an electric device circuit by externally generated fields, comprising:

a specification means for specifying an externally generated field characteristics, a simulation means for calculating coupling from said externally generated fields to at least one device conductor, a calculation means for calculating induced signal levels in said device circuits, whereby said device susceptibility attributes to said externally generated fields coupled to said electric device conductors are calculated and displayed.

12. A method for calculating electromagnetic interference emissions and susceptibility attributes of an electric device, comprising:

providing a memory which stores input data entered by a user relating to an electromagnetic field and calculated data corresponding to the voltage and current induced by said electric device, providing a input means for entering description and simulation parameters entered by a user relating to an electromagnetic field, providing a description means for specifying the parameters of said electric device, providing a simulation means for calculating electromagnetic emissions and susceptibility attributes of said electric device, providing a display means which is operatively connected to said memory for displaying said device parameters, said simulation parameters, and said calculated susceptibility attributes, whereby an electric device is specified and electromagnetic emissions and susceptibility attributes of said electric device are calculated and displayed.

13. The method for calculating of electromagnetic interference according to claim 12, further comprising a step for specifying device active circuit signal attributes, comprising:

providing a translation means for translating said device parameters to an equivalent time-domain waveform, providing a transform means for transforming said equivalent time-domain waveform to a frequency-domain equivalent using the Fast Fourier Transform method, whereby said electric device active circuit signal attributes are translated to an equivalent time-domain waveform and transformed to an equivalent frequency-domain spectrum.

14. The method for calculating electromagnetic interference according to claim 12, further comprising a step for specifying device passive circuit electrical characteristics, comprising:

providing a drawing means for drawing said device passive circuits as schematic diagrams using CAD methods, providing a translation means for translating said schematic diagrams into equivalent circuit representations, providing a calculation means for calculating circuit electrical attributes from said equivalent circuit representations, whereby said device passive circuits are drawn using CAD methods and electrical attributes calculated from translated equivalent circuit data.

15. The method for calculating electromagnetic interference according to claim 12, further comprising a step for calculating a device conductor electrical attributes, comprising:

providing a translation means for translating a device conductor physical parameters into equivalent circuit representations, providing a calculation means for calculating electrical characteristics of a conductor from said circuit representations, whereby said device conductor physical parameters are translated to equivalent circuit electrical characteristics.

16. The method for calculating electromagnetic interference according to claim 12, further comprising a step for calculating transfer impedance of device conductor shield, comprising:

providing a calculation means for calculating shield transfer impedance from a device conductor shield physical parameter, whereby shield transfer impedance of said device conductor shields is calculated.

17. The method for calculating electromagnetic interference according to claim 12, further comprising a step for calculating a device conductor shield termination electrical attributes, comprising:

providing a translation means for translating device conductor shield termination physical parameters into equivalent circuit representations, providing a calculation means for calculating electrical characteristics of said device conductor shield terminations from said equivalent circuit representations, whereby said device conductor shield termination physical parameters are translated into equivalent circuit electrical characteristics.

18. The method for calculating electromagnetic interference according to claim 12, further comprising a step for comparing calculated attributes to prescribed values entered by a user relating to an electromagnetic field, comprising:

providing an input means for entering said prescribed values at prescribed intervals, providing a graphical or numerical comparison means, whereby calculated attributes of said electric device are compared to prescribed values.

19. The method for calculating electromagnetic interference according to claim 12, comprising:

providing a specification means for specifying device active circuit signal attributes, providing a specification means for specifying device passive circuit electrical characteristics, providing a calculation means for calculating device conductor electrical attributes, providing a calculation means for calculating device conductor shield attributes, whereby conducted emissions produced by said electric device are calculated and displayed.

20. The method for calculating electromagnetic interference according to claim 12, comprising:
 providing a specification means for specifying externally generated signal characteristics,
 providing a simulation means for calculating coupling from said externally generated signals to at least one electric device conductors,
 providing a calculation means for calculating induced signal levels in said device circuits,
 whereby said device susceptibility attributes to said externally generated signals coupled to said at least one electric device conductors are calculated and displayed.

21. The method for calculating electromagnetic interference according to claim 12, comprising:
 providing a specification means for specifying device active circuit signal attributes,
 providing a specification means for specifying device passive circuit electrical characteristics,
 providing a calculation means for calculating device conductor electrical attributes,
 providing a calculation means for calculating device conductor shield attributes,
 providing a calculation means for calculating fields produced by signals on said device conductors,
 whereby, radiated emissions produced by electric device conductors are calculated and displayed.

22. The method for calculating electromagnetic interference according to claim 12, comprising:
 providing a specification means for specifying externally generated field characteristics,
 providing a simulation means for calculating coupling from said externally generated fields to device conductors,
 providing a calculation means for calculating induced signal levels in said device circuits,
 whereby said electric device susceptibility attributes to said externally generated fields coupled to said device conductors are calculated and displayed.

* * * * *